(12) United States Patent
Wang et al.

(10) Patent No.: US 11,323,127 B2
(45) Date of Patent: May 3, 2022

(54) DIGITAL-TO-ANALOG CONVERSION CIRCUIT AND METHOD, AND DISPLAY DEVICE

(71) Applicant: BOE TECHNOLOGY GROUP CO., LTD., Beijing (CN)

(72) Inventors: Tangxiang Wang, Beijing (CN); Chen Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 406 days.

(21) Appl. No.: 16/607,832

(22) PCT Filed: Apr. 18, 2019

(86) PCT No.: PCT/CN2019/083156
§ 371 (c)(1),
(2) Date: Oct. 24, 2019

(87) PCT Pub. No.: WO2019/214412
PCT Pub. Date: Nov. 14, 2019

(65) Prior Publication Data
US 2021/0359695 A1  Nov. 18, 2021

(30) Foreign Application Priority Data
May 9, 2018  (CN) .......................... 201810436730.4

(51) Int. Cl.
H03M 1/10  (2006.01)
H03M 1/66  (2006.01)
G09G 3/20  (2006.01)

(52) U.S. Cl.
CPC ........... *H03M 1/1023* (2013.01); *H03M 1/66* (2013.01); *G09G 3/20* (2013.01);
(Continued)

(58) Field of Classification Search
CPC ........ H03M 1/1023; H03M 1/66; H03M 1/68; H03M 1/661; G09G 3/20; G09G 2310/027; G09G 2320/0693; G09G 2330/021
(Continued)

(56) References Cited

U.S. PATENT DOCUMENTS 6,255,978 B1 * 7/2001 Chang ................... H03M 1/664
341/120
7,286,071 B1 * 10/2007 Hsueh .................. G09G 3/2092
341/144

(Continued)

FOREIGN PATENT DOCUMENTS

CN   105188204 A   12/2015
CN   106330194 A   1/2017
(Continued)

OTHER PUBLICATIONS

First Office Action for Chinese Application No. 201810436730.4, dated Dec. 31, 2019, 5 Pages.
(Continued)

*Primary Examiner* — Khai M Nguyen
(74) *Attorney, Agent, or Firm* — Brooks Kushman P.C.

(57) ABSTRACT

A digital-to-analog conversion circuit, a digital-to-analog conversion method, and a display device are provided. The digital-to-analog conversion circuit includes a first digital-to-analog conversion sub-circuit and a second digital-to-analog conversion sub-circuit. The second digital-to-analog conversion sub-circuit includes least-significant-bit voltage selection modules whose quantity is a, a weighed summation operational amplifier, switching control modules whose quantity is a and energy storage modules whose quantity is a. The weighted summation operational amplifier includes a reverse-phase input end, an operational amplification output end, and same-phase input ends whose quantity is a. The (Continued)

reverse-phase input end is connected to the operational amplification output end, and a is an integer greater than 1. The weighted summation operational amplifier is configured to perform weighted summation on voltages inputted by the a same-phase input ends at a digital-to-analog conversion stage to acquire an analog voltage, and output the analog voltage via the operational amplification output end.

15 Claims, 5 Drawing Sheets

(52) U.S. Cl.
CPC .............. *G09G 2310/027* (2013.01); *G09G 2320/0693* (2013.01); *G09G 2330/021* (2013.01)

(58) Field of Classification Search
USPC ........................................ 341/120, 144, 145
See application file for complete search history.

(56) References Cited

U.S. PATENT DOCUMENTS

| | | |
|---|---|---|
| 2008/0191916 A1 | 8/2008 | Shin et al. |
| 2008/0297390 A1 | 12/2008 | Ko et al. |
| 2017/0053584 A1 | 2/2017 | Takahashi |
| 2018/0358978 A1 | 12/2018 | Wang |
| 2019/0036542 A1 | 1/2019 | Wang et al. |

FOREIGN PATENT DOCUMENTS

| | | |
|---|---|---|
| CN | 106469546 A | 3/2017 |
| CN | 106788442 A | 5/2017 |
| CN | 107342042 A | 11/2017 |
| CN | 108599771 A | 9/2018 |

OTHER PUBLICATIONS

International Search Report and Written Opinion for Application No. PCT/CN2019/083156, dated July 3, 2019, 10 Pages.

* cited by examiner at a digital-to-analog conversion stage and an offset voltage calibration stage, controlling, by an $A^{th}$ switching control module, an $A^{th}$ selection output end to be electrically connected to, or electrically disconnected from, an $A^{th}$ same-phase node, controlling, by the $A^{th}$ switching control module, the $A^{th}$ same-phase node to be electrically connected to, or electrically disconnected from, a first level input end, controlling, by the $A^{th}$ switching control module, a first end of an $A^{th}$ energy storage module to be electrically connected to an $A^{th}$ same-phase input end or the first level input end, controlling, by the $A^{th}$ switching control module, a second end of the $A^{th}$ energy storage module to be electrically connected to the $A^{th}$ same-phase node or a reverse-phase input end, and controlling, by the $A^{th}$ switching control module, the $A^{th}$ same-phase node to be electrically connected to, or electrically disconnected from, the $A^{th}$ same-phase input end;

at the digital-to-analog conversion stage, converting, by a first digital-to-analog conversion sub-circuit, binary digits of m most significant bits in a binary digital signal having m+n bits into a first voltage and a second voltage greater than the first voltage, performing, by a weighted summation operational amplifier of a second digital-to-analog conversion sub-circuit, weighted summation on voltages inputted by a same-phase input ends to acquire an analog voltage, outputting, by the weighted summation operational amplifier, the analog voltage via an operational amplification output end, and outputting, by an $A^{th}$ least-significant-bit voltage selection module, the first voltage or the second voltage via the $A^{th}$ selection output end in accordance with a binary digit of n least significant bits in the binary digital signal having m+n bits, where m and n are each an integer greater than 1, a is an integer greater than 1, and A is a positive integer smaller than or equal to a

DIGITAL-TO-ANALOG CONVERSION CIRCUIT AND METHOD, AND DISPLAY DEVICE

CROSS-REFERENCE TO RELATED APPLICATIONS

This application is the U.S. national phase of PCT Application No. PCT/CN2019/083156 filed on Apr. 18, 2019, which claims priority to Chinese Patent Application No. 201810436730.4 filed on May 9, 2018, which are incorporated herein by reference in their entireties.

TECHNICAL FIELD

The present disclosure relates to the field of digital-to-analog (DA) conversion technology, in particular to a DA conversion circuit, a DA conversion method, and a display device.

BACKGROUND

Recently, due to such advantages as being ultra-thin and ultra-light, wide viewing angle, low power consumption, rapid response and vivid color as compared with the other display techniques, Active-Matrix Organic Light-Emitting Diodes (AMOLEDs) have been widely applied to televisions or flat-panel computers.

SUMMARY

In one aspect, the present disclosure provides in some embodiments a digital-to-analog conversion circuit, including a first digital-to-analog conversion sub-circuit and a second digital-to-analog conversion sub-circuit. The digital-to-analog conversion circuit is configured to perform digital-to-analog conversion on a binary digital signal having m+n bits, where m and n are each an integer greater than 1. The first digital-to-analog conversion sub-circuit is configured to convert binary digits of m most significant bits in the binary digital signal having m+n bits into a first voltage and a second voltage, the first voltage is smaller than the second voltage. The second digital-to-analog conversion sub-circuit includes least-significant-bit voltage selection modules whose quantity is a, a weighed summation operational amplifier, switching control modules whose quantity is a and energy storage modules whose quantity is a. The weighted summation operational amplifier includes a reverse-phase input end, an operational amplification output end, and same-phase input ends whose quantity is a. The reverse-phase input end is connected to the operational amplification output end. The weighted summation operational amplifier is configured to perform weighted summation on voltages inputted by the a same-phase input ends at a digital-to-analog conversion stage to acquire an analog voltage, and output the analog voltage via the operational amplification output end, where a is an integer greater than 1. An $A^{th}$ least-significant-bit voltage selection module includes an $A^{th}$ selection output end. The $A^{th}$ least-significant-bit voltage selection module is configured to output the first voltage or the second voltage via the $A^{th}$ selection output end in accordance with a binary digit of a corresponding one of n least significant bits in the binary digital signal having m+n bits, where A is a positive integer smaller than or equal to a. An $A^{th}$ switching control module is configured to control the $A^{th}$ selection output end to be electrically connected to, or electrically disconnected from, an $A^{th}$ same-phase node, control the $A^{th}$ same-phase node to be electrically connected to, or electrically disconnected from, a first level input end, control a first end of an $A^{th}$ energy storage module to be electrically connected to an $A^{th}$ same-phase input end or the first low level input end, control a second end of the $A^{th}$ energy storage module to be electrically connected to the $A^{th}$ same-phase node or the reverse-phase input end, and control the $A^{th}$ same-phase node to be electrically connected to, or electrically disconnected from, the $A^{th}$ same-phase input end.

In a possible embodiment of the present disclosure, the $A^{th}$ switching control module is further configured to, at an offset voltage calibration stage, control the $A^{th}$ same-phase node to be electrically connected to the first level input end, control the first end of the $A^{th}$ energy storage module to be electrically connected to the first level input end, control the second end of the $A^{th}$ energy storage module to be electrically connected to the reverse-phase input end, and control the $A^{th}$ same-phase node to be electrically connected to the $A^{th}$ same-phase input end. The $A^{th}$ switching control module is further configured to, at the digital-to-analog conversion stage, control the $A^{th}$ same-phase node to be electrically disconnected from the first level input end, control the first end of the $A^{th}$ energy storage module to be electrically disconnected from the first level input end, control the second end of the $A^{th}$ energy storage module to be electrically disconnected from the reverse-phase input end, control the $A^{th}$ same-phase node to be electrically disconnected from the $A^{th}$ same-phase input end, control the $A^{th}$ selection output end to be electrically connected to the $A^{th}$ same-phase node, control the first end of the $A^{th}$ energy storage module to be electrically connected to the $A^{th}$ same-phase input end, and control the second end of the $A^{th}$ energy storage module to be electrically connected to the $A^{th}$ same-phase node.

In a possible embodiment of the present disclosure, the digital-to-analog conversion circuit further includes a bias current control sub-circuit configured to supply a first bias current to the weighted summation operational amplifier at the offset voltage calibration stage, and supply a second bias current to the weighted summation operational amplifier at the digital-to-analog conversion stage, wherein the first bias current is smaller than the second bias current.

In a possible embodiment of the present disclosure, a is equal to n+1, N is a positive integer smaller than or equal to n, and the first voltage is applied to an $(n+1)^{th}$ same-phase input end of the weighted summation operational amplifier. An $N^{th}$ least-significant-bit voltage selection module is configured to output the first voltage or the second voltage via an $N^{th}$ selection output end in accordance with an $N^{th}$ digit of the binary digits of n least significant bits ranked in a descending order in the binary digital signal having m+n bits. An $N^{th}$ switching control module is configured to control the $N^{th}$ selection output end to be electrically connected to, or electrically disconnected from, an $N^{th}$ same-phase node, control the $N^{th}$ same-phase node to be electrically connected to, or electrically disconnected from, the first level input end, control a first end of an $N^{th}$ energy storage module to be electrically connected to an $N^{th}$ same-phase input end or the first level input end, control a second end of the $N^{th}$ energy storage module to be electrically connected to the $N^{th}$ same-phase node or the reverse-phase input end, and control the $N^{th}$ same-phase node to be electrically connected to, or electrically disconnected from, the $N^{th}$ same-phase input end. An $(n+1)^{th}$ switching control module is configured to control an $(n+1)^{th}$ selection output end to be electrically connected to, or electrically disconnected from, an $(n+1)^{th}$ same-phase node, control the $(n+1)^{th}$ same-phase node to be electrically connected to, or electrically disconnected from, the first level input end, control a first end of an $(n+1)^{th}$ energy storage module to be electrically connected to the $(n+1)^{th}$ same-phase input end or the first level input end, control a second end of the $(n+1)^{th}$ energy storage module to be electrically connected to the $(n+1)^{th}$ same-phase node or the reverse-phase input end, and control the $(n+1)^{th}$ same-phase node to be electrically connected to, or electrically disconnected from, the $(n+1)^{th}$ same-phase input end.

In a possible embodiment of the present disclosure, the $A^{th}$ energy storage module includes an $A^{th}$ capacitor, and the $A^{th}$ switching control module includes an $A^{th}$ control sub-module, a $(5A-4)^{th}$ switching element, a $(5A-3)^{th}$ switching element, a $(5A-2)^{th}$ switching element, a $(5A-1)^{th}$ switching element and a $(5A)^{th}$ switching element. A control end of the $(5A-4)^{th}$ switching element, a control end of the $(5A-3)^{th}$ switching element, a control end of the $(5A-2)^{th}$ switching element, a control end of the $(5A-1)^{th}$ switching element and a control end of the $(5A)^{th}$ switching element are connected to the $A^{th}$ control sub-module. The $A^{th}$ control sub-module is configured to output a first control signal at the offset voltage calibration stage, and output a second control signal at the digital-to-analog conversion stage. A first end of the $(5A-4)^{th}$ switching element is connected to the $A^{th}$ selection output end, and a second end of the $(5A-4)^{th}$ switching element is connected to the $A^{th}$ same-phase node. The $(5A-4)^{th}$ switching element is configured to control the $A^{th}$ selection output end to be electrically disconnected from the $A^{th}$ same-phase node when the control end of the $(5A-4)^{th}$ switching element has received the first control signal, and control the $A^{th}$ selection output end to be electrically connected to the $A^{th}$ same-phase node when the control end of the $(5A-4)^{th}$ switching element has received the second control signal. A first end of the $(5A-3)^{th}$ switching element is connected to the $A^{th}$ same-phase node, and a second end of the $(5A-3)^{th}$ switching element is connected to the first level input end. The $(5A-3)^{th}$ switching element is configured to control the $A^{th}$ same-phase node to be electrically connected to the first level input end when the control end of the $(5A-3)^{th}$ switching element has received the first control signal, and control the $A^{th}$ same-phase node to be electrically disconnected from the first level input end when the control end of the $(5A-3)^{th}$ switching element has received the second control signal. A first end of the $(5A-2)^{th}$ switching element is connected to the $A^{th}$ same-phase input end, a fixed end of the $(5A-2)^{th}$ switching element is connected to a first end of the $A^{th}$ capacitor, and a second end of the $(5A-2)^{th}$ switching element is connected to the first level input end. The $(5A-2)^{th}$ switching element is configured to control the first end of the $A^{th}$ capacitor to be electrically connected to the first level input end when the control end of the $(5A-2)^{th}$ switching element has received the first control signal, and control the first end of the $A^{th}$ capacitor to be electrically disconnected from the first level input end and control the first end of the $A^{th}$ capacitor to be electrically connected to the $A^{th}$ same-phase input end when the control end of the $(5A-2)^{th}$ switching element has received the second control signal. A first end of the $(5A-1)^{th}$ switching element is connected to the $A^{th}$ same-phase node, a fixed end of the $(5A-1)^{th}$ switching element is connected to a second end of the $A^{th}$ capacitor, and a second end of the $(5A-1)^{th}$ switching element is connected to the reverse-phase input end. The $(5A-1)^{th}$ switching element is configured to control the second end of the $A^{th}$ capacitor to be electrically connected to the reverse-phase input end when the control end of the $(5A-1)^{th}$ switching element has received the first control signal, and control the second end of the $A''$ capacitor to be electrically disconnected from the reverse-phase input end and control the second end of the $A''$ capacitor to be electrically connected to the $A''$ same-phase node when the control end of the $(5A-1)^{th}$ switching element has received the second control signal. A first end of the $(5A)^{th}$ switching element is connected to the $A''$ same-phase node, and a second end of the $(5A)^{th}$ switching element is connected to the $A''$ same-phase input end. The $(5A)^{th}$ switching element is configured to control the $A''$ same-phase node to be electrically connected to the $A''$ same-phase input end when the control end of the $(5A)^{th}$ switching element has received the first control signal, and control the $A''$ same-phase node to be electrically disconnected from the $A''$ same-phase input end when the control end of the $(5A)^{th}$ switching element has received the second control signal.

In a possible embodiment of the present disclosure, the first digital-to-analog conversion sub-circuit includes a reference voltage output module, an input voltage control module, a most-significant-bit voltage selection module and a voltage storage module. The most-significant-bit voltage selection module includes $2^m$ input voltage ends, and the reference voltage output module includes $2^m+1$ reference voltage output ends. The reference voltage output module is configured to output $2^m+1$ reference voltages whose values increase gradually via the $2^m+1$ reference voltage output ends. The input voltage control module is connected to an input voltage control end, the $2^m+1$ reference voltage output ends and the $2^m$ input voltage ends, and configured to, under the control of the input voltage control end, input the corresponding reference voltages to the $2^m$ input voltage ends via a first reference voltage output end to a $(2m)^{th}$ reference voltage output end respectively within a first time period of each input period, and input the corresponding reference voltages to the $2^m$ input voltage ends via a second reference voltage output end to a $(2m+1)^{th}$ reference voltage output end respectively within a second time period of each input period. The most-significant-bit voltage selection module includes a selection voltage output end, and is configured to select the reference voltage inputted by an $M^{th}$ input voltage end, and output the selected reference voltage to the voltage storage module via the selection voltage output end, where M is a decimal digit corresponding to the binary digits of m most significant bits in the binary digital signal having m+n bits. The voltage storage module is connected to a voltage storage control end, and configured to, under the control of the voltage storage control end, store and output the first voltage outputted by the most-significant-bit voltage selection module within the first time period and the second voltage outputted by the most-significant-bit voltage selection module within the second time period, and the first voltage is smaller than the second voltage. The voltage storage module includes a first voltage output end for outputting the first voltage and a second voltage output end for outputting the second voltage.

In a possible embodiment of the present disclosure, the reference voltage output module includes a resistor string, a first end of which is connected to a first power source voltage input end and a second end of which is connected to a second power source voltage input end. A first power source voltage inputted by the first power source voltage input end is smaller than a second power source voltage inputted by the second power source voltage input end. The resistor string includes $2^m$ divider resistors connected in serial to each other. The first power source voltage input end is connected to the first reference voltage output end, and the second power source voltage input end is connected to the $(2^m+1)^{th}$ reference voltage output end. A connection line between a $C^{th}$ divider resistor and a $(C+1)^{th}$ divider resistor is connected to a $(C+1)^{th}$ reference voltage output end of the reference voltage output module, where C+1 is smaller than or equal to $2^m$, and C is a positive integer.

In a possible embodiment of the present disclosure, the most-significant-bit voltage selection module includes a binary switch tree. The binary switch tree includes m layers, a $w^{th}$ layer includes $2^w$ switch branches, where w is a positive integer smaller than m. The $w^{th}$ layer is connected between a $(w-1)^{th}$ layer and a $(w+1)^{th}$ layer. Two switch branches of a first layer are connected to the selection voltage output end, and $2^m$ switch branches of an $m^{th}$ layer are connected to the $2^m$ input voltage ends of the input voltage control module respectively. Every two adjacent switch branches in each layer are connected to each other.

In a possible embodiment of the present disclosure, a single transistor is adopted by each switch branch as a switching element.

In a possible embodiment of the present disclosure, each switching element is an n-type or p-type transistor.

In a possible embodiment of the present disclosure, the $w^{th}$ layer of the binary switch tree includes $2^{w-1}$ n-type transistors and $2^{w-1}$ p-type transistors. A first electrode of each transistor is configured to receive the corresponding input voltage. Gate electrodes of all the transistors are configured to receive Dk and Dk' alternately, where Dk represents an $(m+n-w+1)^{th}$ binary digit of the binary digits ranked in an ascending order in the binary digital signal having m+n bits, and Dk' represents a binary digit complementary to Dk.

In a possible embodiment of the present disclosure, the weighted summation operational amplifier is a multi-input buffer, a is equal to 4, and the weighted summation operational amplifier includes four differential input pair transistors corresponding to four same-phase input ends respectively. A ratio among a width-to-length ratio of a first differential input pair transistors corresponding to a first same-phase input end, a width-to-length ratio of a second differential input pair transistors corresponding to a second same-phase input end, a width-to-length ratio of a third second differential input pair transistors corresponding to a third same-phase input end and a width-to-length ratio of a fourth differential input pair transistors corresponding to a fourth same-phase input end is 4:2:1:1.

In another aspect, the present disclosure provides in some embodiments a digital-to-analog conversion method for the above-mentioned digital-to-analog conversion circuit, including: at a digital-to-analog conversion stage and an offset voltage calibration stage, controlling, by an $A^{th}$ switching control module, an $A^{th}$ selection output end to be electrically connected to, or electrically disconnected from, an $A^{th}$ same-phase node, controlling, by the $A^{th}$ switching control module, the $A^{th}$ same-phase node to be electrically connected to, or electrically disconnected from, a first level input end, controlling, by the $A^{th}$ switching control module, a first end of an $A^{th}$ energy storage module to be electrically connected to an $A^{th}$ same-phase input end or the first level input end, controlling, by the $A^{th}$ switching control module, a second end of the $A^{th}$ energy storage module to be electrically connected to the $A^{th}$ same-phase node or a reverse-phase input end, and controlling, by the $A^{th}$ switching control module, the $A^{th}$ same-phase node to be electrically connected to, or electrically disconnected from, the $A^{th}$ same-phase input end; and at the digital-to-analog conversion stage, converting, by a first digital-to-analog conversion sub-circuit, binary digits of m most significant bits in a binary digital signal having m+n bits into a first voltage and a second voltage greater than the first voltage, performing, by a weighted summation operational amplifier of a second digital-to-analog conversion sub-circuit, weighted summation on voltages inputted by a same-phase input ends to acquire an analog voltage, outputting, by the weighted summation operational amplifier, the analog voltage via an operational amplification output end, and outputting, by an $A^{th}$ least-significant-bit voltage selection module, the first voltage or the second voltage via the $A^{th}$ selection output end in accordance with a binary digit of a corresponding one of n least significant bits in the binary digital signal having m+n bits, where m and n are each an integer greater than 1, a is an integer greater than 1, and A is a positive integer smaller than or equal to a.

In a possible embodiment of the present disclosure, the controlling, by the $A^{th}$ switching control module, the $A^{th}$ selection output end to be electrically connected to, or electrically disconnected from, the $A^{th}$ same-phase node, controlling, by the $A^{th}$ switching control module, the $A^{th}$ same-phase node to be electrically connected to, or electrically disconnected from, the first level input end, controlling, by the $A^{th}$ switching control module, the first end of the $A^{th}$ energy storage module to be electrically connected to the $A^{th}$ same-phase input end or the first level input end, controlling, by the $A^{th}$ switching control module, the second end of the $A^{th}$ energy storage module to be electrically connected to the $A^{th}$ same-phase node or the reverse-phase input end, and controlling, by the $A^{th}$ switching control module, the $A^{th}$ same-phase node to be electrically connected to, or electrically disconnected from, the $A^{th}$ same-phase input end includes: at the offset voltage calibration stage, controlling, by the $A^{th}$ switching control module, the $A^{th}$ same-phase node to be electrically connected to the first level input end, controlling, by the $A^{th}$ switching control module, the first end of the $A^{th}$ energy storage module to be electrically connected to the first level input end, controlling, by the $A^{th}$ switching control module, the second end of the $A^{th}$ energy storage module to be electrically connected to the reverse-phase input end, and controlling, by the $A^{th}$ switching control module, the $A^{th}$ same-phase node to be electrically connected to the $A^{th}$ same-phase input end; and at the digital-to-analog conversion stage, controlling, by the $A^{th}$ switching control module, the $A^{th}$ same-phase node to be electrically disconnected from the first level input end, controlling, by the $A^{th}$ switching control module, the first end of the $A^{th}$ energy storage module to be electrically disconnected from the first level input end, controlling, by the $A^{th}$ switching control module, the second end of the $A^{th}$ energy storage module to be electrically disconnected from the reverse-phase input end, controlling, by the $A^{th}$ switching control module, the $A^{th}$ same-phase node to be electrically disconnected from the $A^{th}$ same-phase input end, controlling, by the $A^{th}$ switching control module, the $A^{th}$ selection output end to be electrically connected to the $A^{th}$ same-phase node, controlling, by the $A^{th}$ switching control module, the first end of the $A^{th}$ energy storage module to be electrically connected to the $A^{th}$ same-phase input end, and controlling, by the $A^{th}$ switching control module, the second end of the $A^{th}$ energy storage module to be electrically connected to the $A^{th}$ same-phase node.

In yet another aspect, the present disclosure provides in some embodiments a display device including the above-mentioned digital-to-analog conversion circuit.

BRIEF DESCRIPTION OF THE DRAWINGS

FIG. 6 is a flow chart of a digital-to-analog conversion method according to one embodiment of the present disclosure.

DETAILED DESCRIPTION

Figure 1:
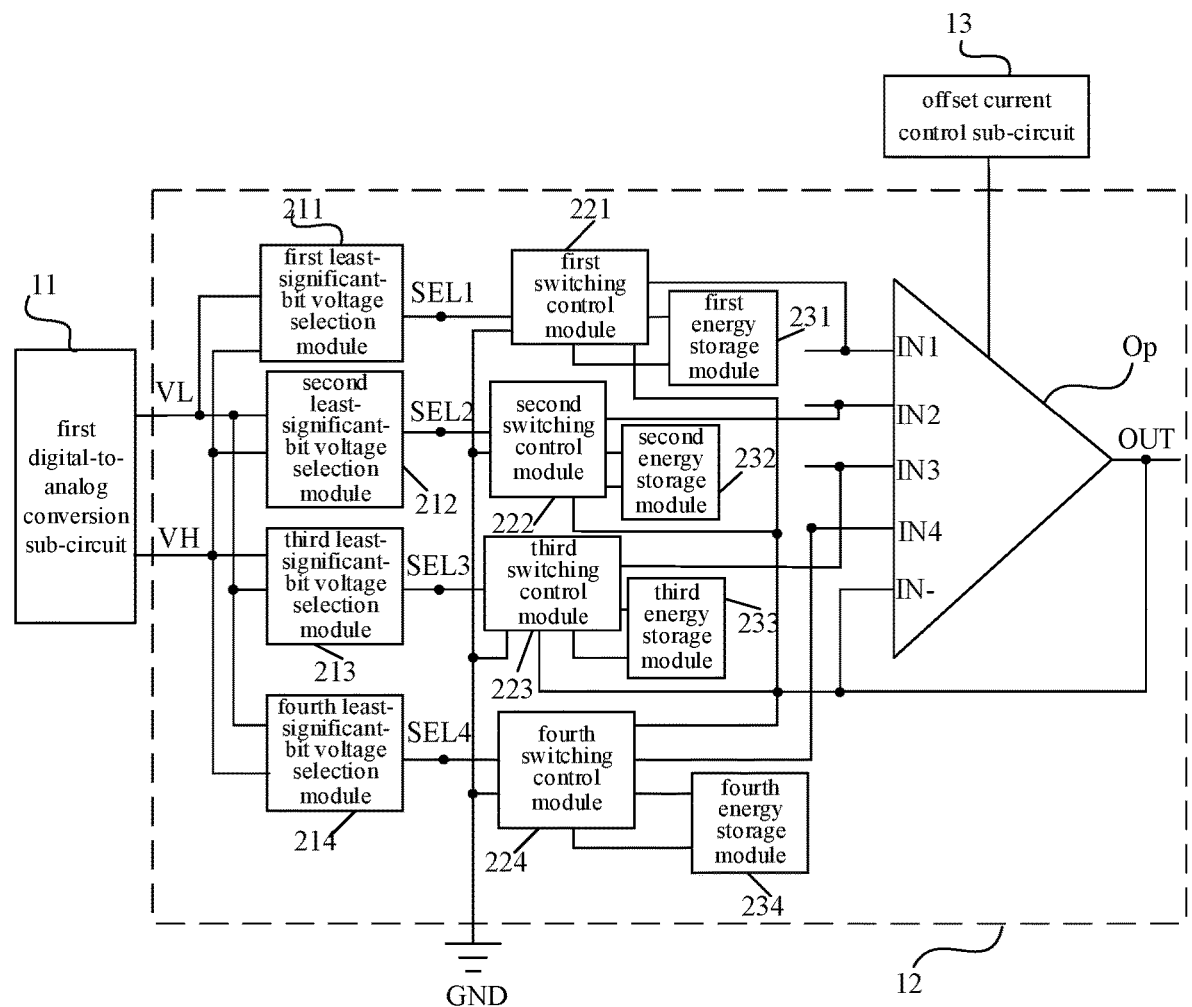
FIG. 1 is a schematic view showing a digital-to-analog conversion circuit according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure.

Along with the development of the high-definition television technique, it is impossible to support 8K display at a conventional transmission rate and 10-bit definition. For the 8K display, it is necessary to use 12-bit digital-to-analog conversion, which brings a challenge to the accuracy of a buffer operational amplifier, in a digital-to-analog converter. For the 12-bit digital-to-analog conversion, an offset voltage of the buffer operational amplifier needs to be less than 1 mv, but in related art, the offset voltage is within the range of 2 mv to 10 mv.

All transistors adopted in the embodiments of the present disclosure may be thin film transistors (TFTs), field effect transistors (FETs) or any other elements having an identical characteristic. In order to differentiate two electrodes other than a gate electrode from each other, one of the two electrodes is called as first electrode and the other is called as second electrode. In actual use, the first electrode may be a drain electrode while the second electrode may be a source electrode, or the first electrode may be a source electrode while the second electrode may be a drain electrode.

The present disclosure provides in some embodiments a digital-to-analog conversion circuit for performing digital-to-analog conversion on a binary digital signal having m+n bits, where m and n are each an integer greater than 1. The digital-to-analog conversion circuit includes a first digital-to-analog conversion sub-circuit and a second digital-to-analog conversion sub-circuit. The first digital-to-analog conversion sub-circuit is configured to convert binary digits of m most significant bits in the binary digital signal having m+n bits into a first voltage and a second voltage, wherein the first voltage is smaller than the second voltage.

The second digital-to-analog conversion sub-circuit includes least-significant-bit voltage selection modules whose quantity is a, a weighed summation operational amplifier, switching control modules whose quantity is a and energy storage modules whose quantity is a, where a is an integer greater than 1. The weighted summation operational amplifier includes a reverse-phase input end, an operational amplification output end, and same-phase input ends whose quantity is a. The reverse-phase input end is connected to the operational amplification output end. The weighted summation operational amplifier is configured to perform weighted summation on voltages inputted by the a same-phase input ends at a digital-to-analog conversion stage to acquire an analog voltage, and output the analog voltage via the operational amplification output end.

An $A^{th}$ least-significant-bit voltage selection module includes an $A^{th}$ selection output end. The $A^{th}$ least-significant-bit voltage selection module is configured to output the first voltage or the second voltage via the $A^{th}$ selection output end in accordance with a binary digit of a corresponding one of n least significant bits in the binary digital signal having m+n bits, where A is a positive integer smaller than or equal to a.

An $A^{th}$ switching control module is configured to control the $A^{th}$ selection output end to be electrically connected to, or electrically disconnected from, an $A^{th}$ same-phase node, control the $A^{th}$ same-phase node to be electrically connected to, or electrically disconnected from, a first level input end, control a first end of an $A^{th}$ energy storage module to be electrically connected to an $A^{th}$ same-phase input end or the first low level input end, control a second end of the $A^{th}$ energy storage module to be electrically connected to the $A^{th}$ same-phase node or the reverse-phase input end, and control the $A^{th}$ same-phase node to be electrically connected to, or electrically disconnected from, the $A^{th}$ same-phase input end.

In some embodiments of the present disclosure, the first level input end may be a low level input end or a ground end.

In some embodiments of the present disclosure, the $A^{th}$ switching control module is further configured to, at an offset voltage calibration stage, control the $A^{th}$ same-phase node to be electrically connected to the first level input end, control the first end of the $A^{th}$ energy storage module to be electrically connected to the first level input end, control the second end of the $A^{th}$ energy storage module to be electrically connected to the reverse-phase input end, and control the $A^{th}$ same-phase node to be electrically connected to the $A^{th}$ same-phase input end.

The $A^{th}$ switching control module is further configured to, at the digital-to-analog conversion stage, control the $A^{th}$ same-phase node to be electrically disconnected from the first level input end, control the first end of the $A^{th}$ energy storage module to be electrically disconnected from the first level input end, control the second end of the $A^{th}$ energy storage module to be electrically disconnected from the reverse-phase input end, control the $A^{th}$ same-phase node to be electrically disconnected from the $A^{th}$ same-phase input end, control the $A^{th}$ selection output end to be electrically connected to the $A^{th}$ same-phase node, control the first end of the $A^{th}$ energy storage module to be electrically connected to the $A^{th}$ same-phase input end, and control the second end of the $A^{th}$ energy storage module to be electrically connected to the $A^{th}$ same-phase node.

An operating procedure of the digital-to-analog conversion circuit may include the offset voltage calibration stage and the digital-to-analog conversion stage.

At the offset voltage calibration stage, the $A^{th}$ switching control module may control the $A^{th}$ selection output end to be electrically disconnected from the $A^{th}$ same-phase input end, control the $A^{th}$ same-phase node to be electrically connected to the first level input end, control the first end of the $A^{th}$ energy storage module to be electrically connected to the first level input end, control the second end of the $A^{th}$ energy storage module to be electrically connected to the reverse-phase input end, and control the $A^{th}$ same-phase node to be electrically connected to the $A^{th}$ same-phase input end. At this time, it is able to compensate for an offset voltage of the weighted summation operational amplifier through the voltages stored in the a energy storage modules.

At the digital-to-analog conversion stage, $A^{th}$ switching control module may control the $A^{th}$ selection output end to be electrically connected to the $A^{th}$ same-phase node, control the $A^{th}$ same-phase node to be electrically disconnected from the first level input end, control the first end of the $A^{th}$ energy storage module to be electrically connected to the $A^{th}$ same-phase input end, control the second end of the $A^{th}$ energy storage module to be electrically connected to the $A^{th}$ same-phase node, and control the $A^{th}$ same-phase node to be electrically disconnected from the $A^{th}$ same-phase input end. The first digital-to-analog conversion sub-circuit may convert the binary digits of m most significant bits in the binary digital signal having m+n bits into the first voltage and the second voltage, wherein the first voltage is smaller than the second voltage. The $A^{th}$ least-significant-bit voltage selection module may output the first voltage or the second voltage via the $A^{th}$ selection output end in accordance with the binary digit of the corresponding one of n least significant bits in the binary digital signal having m+n bits. The weighted summation operational amplifier of the second digital-to-analog conversion sub-circuit may perform the weighted summation on the voltages inputted by the a same-phase input ends to acquire the analog voltage, and then output the analog voltage via the operational amplification output end.

According to the digital-to-analog conversion circuit in the embodiments of the present disclosure, it is able to compensate for the offset voltage of the weighted summation operational amplifier through the a switching control modules and the a energy storage modules at the offset voltage calibration stage, and perform the 12-bits digital-to-analog conversion at the digital-to-analog conversion stage at high accuracy sufficient to meet the requirement of a large-size, high-definition product.

In some embodiments of the present disclosure, the digital-to-analog conversion circuit may further include a bias current control sub-circuit 13 configured to supply a first bias current to the weighted summation operational amplifier at the offset voltage calibration stage, and supply a second bias current bias current to the weighted summation operational amplifier at the digital-to-analog conversion stage, the first bias current is smaller than the second bias current.

In the embodiments of the present disclosure, through the additional bias current control sub-circuit, the first bias current smaller than the second bias current may be supplied to the weighted summation operational amplifier at the offset voltage calibration stage, and the second bias current greater than the first bias current may be supplied to the weighted summation operational amplifier at the digital-to-analog conversion stage. When a large bias current needs to be supplied for a high gain, the bias current may be supplied in a flexible manner, To be specific, a small bias current may be supplied during the offset voltage compensation, and a large bias current may be supplied during the data transmission. As a result, it is able for the digital-to-analog conversion circuit to meet the requirement of the large-size and high-definition product without increasing the power consumption remarkably.

In some embodiments of the present disclosure, a may be equal to n+1, and N may be a positive integer smaller than or equal to n. The first voltage may be applied to an $(n+1)^{th}$ same-phase input end of the weighted summation operational amplifier. An $N^{th}$ least-significant-bit voltage selection module is configured to output the first voltage or the second voltage via an $N^{th}$ selection output end in accordance with an $N^{th}$ digit of the binary digits of n least significant bits ranked in a descending order in the binary digital signal having m+n bits. An $N^{th}$ switching control module is configured to control the $N^{th}$ selection output end to be electrically connected to, or electrically disconnected from, an $N^{th}$ same-phase node, control the $N^{th}$ same-phase node to be electrically connected to, or electrically disconnected from, the first level input end, control a first end of an $N^{th}$ energy storage module to be electrically connected to an $N^{th}$ same-phase input end or the first level input end, control a second end of the $N^{th}$ energy storage module to be electrically connected to the $N^{th}$ same-phase node or the reverse-phase input end, and control the $N^{th}$ same-phase node to be electrically connected to, or electrically disconnected from, the $N^{th}$ same-phase input end. An $(n+1)^{th}$ switching control module is configured to control an $(n+1)^{th}$ selection output end to be electrically connected to, or electrically disconnected from, an $(n+1)^{th}$ same-phase node, control the $(n+1)^{th}$ same-phase node to be electrically connected to, or electrically disconnected from, the first level input end, control a first end of an $(n+1)^{th}$ energy storage module to be electrically connected to the $(n+1)^{th}$ same-phase input end or the first level input end, control a second end of the $(n+1)^{th}$ energy storage module to be electrically connected to the $(n+1)^{th}$ same-phase node or the reverse-phase input end, and control the $(n+1)^{th}$ same-phase node to be electrically connected to, or electrically disconnected from, the $(n+1)^{th}$ same-phase input end.

In some embodiments of the present disclosure, when n is 3, a is 4.

In some embodiments of the present disclosure, as shown in FIG. 1, the digital-to-analog conversion circuit is configured to perform digital-to-analog conversion on a binary digital signal having 9+3 bits. In FIG. 1, the digital-to-analog conversion circuit may include a first digital-to-analog conversion sub-circuit 11 and a second digital-to-analog conversion sub-circuit 12.

The first digital-to-analog conversion sub-circuit 11 is configured to convert binary digits of 9 most significant bits in the binary digital signal having 9+3 bits into a first voltage VL and a second voltage VH, wherein the first voltage VL is smaller than the second voltage VH.

The second digital-to-analog conversion sub-circuit 12 may include a weighed summation operational amplifier Op, a first least-significant-bit voltage selection module 211, a first switching control module 221, a first energy storage module 231, a second least significant-bit voltage selection module 212, a second switching control module 222, a second energy storage module 232, a third least-significant-bit voltage selection module 213, a third switching control module 223, a third energy storage module 233, a fourth least-significant-bit voltage selection module 214, a fourth switching control module 242, and a fourth energy storage module 234.

The weighted summation operational amplifier Op may include a reverse-phase input end IN-, an operational amplification output end OUT, and a first same-phase input end IN1, a second same-phase input end IN2, a third same-phase input end IN3 and a fourth same-phase input end IN4. The reverse-phase input end IN- may be connected to the operational amplification output end OUT.

The weighted summation operational amplifier Op is configured to perform weighted summation on voltages inputted by the first same-phase input end IN1, the second same-phase input end IN2, the third same-phase input end IN3 and the fourth same-phase input end IN4 at the digital-to-analog conversion stage to acquire an analog voltage, and output the analog voltage via the operational amplification output end.

The first least-significant-bit voltage selection module 211 is configured to output the first voltage VL or the second voltage VH via a first selection output end SEL1 in accordance with a third digit D2 of the binary digits ranked in an ascending manner in the binary digital signal having 9+3 bits. The second least-significant-bit voltage selection module 212 is configured to output the first voltage VL or the second voltage VH via a second selection output end SEL2 in accordance with a second digit D1 of the binary digits ranked in an ascending manner in the binary digital signal having 9+3 bits. The third least-significant-bit voltage selection module 213 is configured to output the first voltage VL or the second voltage VH via a third selection output end SEL3 in accordance with a first digit D0 of the binary digits ranked in an ascending manner in the binary digital signal having 9+3 bits. The least-significant-bit voltage selection module 214 is configured to output the first voltage VL via a fourth selection output end SEL4 at the digital-to-analog conversion stage.

The first switching control module 221 may be connected to the first same-phase input end INL the first same-phase node, the first selection output end SEL1, the first end of the first energy storage module 231, the second end of the first energy storage module 231, the reverse-phase input end IN-, and a ground end GND.

The first switching control module 221 is configured to control the first selection output end SEL1 to be electrically connected to, or electrically disconnected from the first same-phase input end IN1, control the first same-phase node to be electrically connected to, or electrically disconnected from, the ground end GND, control the first end of the first energy storage module 231 to be electrically connected to the first same-phase input end IN1 or the ground end GND, control the second end of the first energy storage module 231 to be electrically connected to the first same-phase node or the reverse-phase input end IN-, and control the first same-phase node to be electrically connected to, or electrically disconnected from, the first same-phase input end IN1.

The second switching control module 222 may be connected to the second same-phase input end IN2, the second same-phase node, the second selection output end SEL2, the first end of the second energy storage module 232, the second end of the second energy storage module 232, the reverse-phase input end IN-, and the ground end GND.

The second switching control module 222 is configured to control the second selection output end SEL2 to be electrically connected to, or electrically disconnected from the second same-phase input end IN2, control the second same-phase node to be electrically connected to, or electrically disconnected from, the ground end GND, control the first end of the second energy storage module 232 to be electrically connected to the second same-phase input end IN2 or the ground end GND, control the second end of the second energy storage module 232 to be electrically connected to the second same-phase node or the reverse-phase input end IN-, and control the second same-phase node to be electrically connected to, or electrically disconnected from, the second same-phase input end IN2.

The third switching control module 223 may be connected to the third same-phase input end IN3, the third same-phase node, the third selection output end SEL3, the first end of the third energy storage module 233, the second end of the third energy storage module 233, the reverse-phase input end IN-, and the ground end GND.

The third switching control module 223 is configured to control the third selection output end SEL3 to be electrically connected to, or electrically disconnected from the third same-phase input end IN3, control the third same-phase node to be electrically connected to, or electrically disconnected from, the ground end GND, control the first end of the third energy storage module 233 to be electrically connected to the third same-phase input end IN3 or the ground end GND, control the second end of the third energy storage module 233 to be electrically connected to the third same-phase node or the reverse-phase input end IN-, and control the third same-phase node to be electrically connected to, or electrically disconnected from, the third same-phase input end IN3.

The fourth switching control module 224 may be connected to the fourth same-phase input end IN4, the fourth same-phase node, the fourth selection output end SEL4, the first end of the fourth energy storage module 234, the second end of the fourth energy storage module 234, the reverse-phase input end IN-, and the ground end GND.

The fourth switching control module 224 is configured to control the fourth selection output end SEL4 to be electrically connected to, or electrically disconnected from the fourth same-phase input end IN4, control the fourth same-phase node to be electrically connected to, or electrically disconnected from, the ground end GND, control the first end of the fourth energy storage module 234 to be electrically connected to the fourth same-phase input end IN4 or the ground end GND, control the second end of the fourth energy storage module 234 to be electrically connected to the fourth same-phase node or the reverse-phase input end IN-, and control the fourth same-phase node to be electrically connected to, or electrically disconnected from, the fourth same-phase input end IN4.

The weighted summation operational amplifier Op is configured to perform weighted summation on a voltage Vin1 applied to IN1, a voltage Vin2 applied to IN2, a voltage Vin3 applied to IN3 and the first voltage VL applied to IN4 at the digital-to-analog conversion stage, so as to generate an analog voltage signal corresponding to the binary digital signal having 9+3 bits.

For example, a voltage of the analog voltage signal generated by the weighted summation operational amplifier Op may be ½Vin1+¼Vin2+⅛Vin3+⅛VL.

In some embodiments of the present disclosure, the first least-significant-bit voltage selection module 211, the second least-significant-bit voltage selection module 212 and the third least-significant-bit voltage selection module 213 may each include a Complementary Metal Oxide Semiconductor (CMOS) transmission gate.

The first voltage VL and the second voltage VH may be applied to two input ends of each CMOS transmission gate respectively, D2 may be applied to a control end of the first least-significant-bit voltage selection module 211 as a control signal, D1 may be applied to a control end of the second least-significant-bit voltage selection module 212 as a control signal, and D0 may be applied to a control end of the third least-significant-bit voltage selection module 213 as a control signal.

An output end of the CMOS transmission gate in the first least-significant-bit voltage selection module 211 may be connected to the first same-phase input end IN1 of the weighted summation operational amplifier Op, an output end of the CMOS transmission gate in the second leastsignificant-bit voltage selection module 212 may be connected to the second same-phase input end IN2 of the weighted summation operational amplifier OP, and an output end of the CMOS transmission gate in the third least-significant-bit voltage selection module 213 may be connected to the third same-phase input end IN3 of the weighted summation operational amplifier Op.

For example, when D2 is 0, the first least-significant-bit voltage selection module 211 may output the first voltage VL to the first same-phase input end IN1, and when D2 is 1, the first least-significant-bit voltage selection module 211 may output the second voltage VH to the first same-phase phase input end IN1.

In some embodiments of the present disclosure, the weighted summation operational amplifier Op may be a multi-input buffer. The weighted summation operational amplifier Op may include four differential input pair transistors corresponding to the four same-phase input ends respectively. A ratio among a width-to-length ratio of a first differential input pair transistors corresponding to the first same-phase input end IN1, a width-to-length ratio of a second differential input pair transistors corresponding to the second same-phase input end IN2, a width-to-length ratio of a third second differential input pair transistors corresponding to the third same-phase input end IN3 and a width-to-length ratio of a fourth differential input pair transistors corresponding to the fourth same-phase input end In4 may be 4:2:1:1.

In some embodiments of the present disclosure, reverse-phase input ends of the four differential input pair transistors may be connected to each other, and connected to the reverse-phase input end IN- of the weighted summation operational amplifier Op.

Table 1 shows a correspondence between inputs and outputs of the weighted summation operational amplifier Op.

TABLE 1

| D2D1D0 | Vin1 | Vin2 | Vin3 | Vin4 | Vo |
|---|---|---|---|---|---|
| 000 | VL | VL | VL | VL | VL |
| 001 | VL | VL | VH | VL | 7/8 VL + 1/8 VH |
| 010 | VL | VH | VL | VL | 6/8 VL + 2/8 VH |
| 011 | VL | VH | VH | VL | 5/8 VL + 3/8 VH |
| 100 | VH | VL | VL | VL | 4/8 VL + 4/8 VH |
| 101 | VH | VL | VH | VL | 3/8 VL + 5/8 VH |
| 110 | VH | VH | VL | VL | 2/8 VL + 6/8 VH |
| 111 | VH | VH | VH | VL | 1/8 VL + 7/8 VH |

In Table 1, Vin4 represents a voltage applied to the fourth same-phase input end IN4, and Vo represents a voltage outputted by the weighted summation operational amplifier Op.

In some embodiments of the present disclosure, the digits of n least significant bits may include 2 or 3 digits.

In some embodiments of the present disclosure, the $A^{th}$ energy storage module may include an $A^{th}$ capacitor, and the $A^{th}$ switching control module may include an $A^{th}$ control sub-module, a $(5A-4)^{th}$ switching element, a $(5A-3)^{th}$ switching element, a $(5A-2)^{th}$ switching element, a $(5A-1)^{th}$ switching element and a $(5A)^{th}$ switching element.

A control end of the $(5A-4)^{th}$ switching element, a control end of the $(5A-3)^{th}$ switching element, a control end of the $(5A-2)^{th}$ switching element, a control end of the $(5A-1)^{th}$ switching element and a control end of the $(5A)^{th}$ switching element may be connected to the $A^{th}$ control sub-module. The $A^{th}$ control sub-module is configured to output a first control signal at the offset voltage calibration stage, and output a second control signal at the digital-to-analog conversion stage.

A first end of the $(5A-4)^{th}$ switching element may be connected to the $A^{th}$ selection output end, and a second end of the $(5A-4)^{th}$ switching element may be connected to the $A^{th}$ same-phase node. The $(5A-4)^{th}$ switching element is configured to control the $A^{th}$ selection output end to be electrically disconnected from the $A^{th}$ same-phase node when the control end of the $(5A-4)^{th}$ switching element has received the first control signal, and control the $A^{th}$ selection output end to be electrically connected to the $A^{th}$ same-phase node when the control end of the $(5A-4)^{th}$ switching element has received the second control signal.

A first end of the $(5A-3)^{th}$ switching element may be connected to the $A^{th}$ same-phase node, and a second end of the $(5A-3)^{th}$ switching element may be connected to the first level input end. The $(5A-3)^{th}$ switching element is configured to control the $A^{th}$ same-phase node to be electrically connected to the first level input end when the control end of the $(5A-3)^{th}$ switching element has received the first control signal, and control the $A^{th}$ same-phase node to be electrically disconnected from the first level input end when the control end of the $(5A-3)^{th}$ switching element has received the second control signal.

A first end of the $(5A-2)^{th}$ switching element may be connected to the $A^{th}$ same-phase input end, a fixed end of the $(5A-2)^{th}$ switching element may be connected to a first end of the $A^{th}$ capacitor, and a second end of the $(5A-2)^{th}$ switching element is connected to the first level input end. The $(5A-2)^{th}$ switching element is configured to control the first end of the $A^{th}$ capacitor to be electrically connected to the first level input end when the control end of the $(5A-2)^{th}$ switching element has received the first control signal, and control the first end of the $A^{th}$ capacitor to be electrically disconnected from the first level input end and control the first end of the $A^{th}$ capacitor to be electrically connected to the $A^{th}$ same-phase input end when the control end of the $(5A-2)^{th}$ switching element has received the second control signal.

A first end of the $(5A-1)^{th}$ switching element may be connected to the $A^{th}$ same-phase node, a fixed end of the $(5A-1)^{th}$ switching element may be connected to a second end of the $A^{th}$ capacitor, and a second end of the $(5A-1)^{th}$ switching element may be connected to the reverse-phase input end. The $(5A-1)^{th}$ switching element is configured to control the second end of the $A^{th}$ capacitor to be electrically connected to the reverse-phase input end when the control end of the $(5A-1)^{th}$ switching element has received the first control signal, and control the second end of the $A^{th}$ capacitor to be electrically disconnected from the reverse-phase input end and control the second end of the $A^{th}$ capacitor to be electrically connected to the $A^{th}$ same-phase node when the control end of the $(5A-1)^{th}$ switching element has received the second control signal.

A first end of the $(5A)^{th}$ switching element may be connected to the $A^{th}$ same-phase node, and a second end of the $(5A)^{th}$ switching element may be connected to the $A^{th}$ same-phase input end. The $(5A)^{th}$ switching element is configured to control the $A^{th}$ same-phase node to be electrically connected to the $A^{th}$ same-phase input end when the control end of the $(5A)^{th}$ switching element has received the first control signal, and control the $A^{th}$ same-phase node to be electrically disconnected from the $A^{th}$ same-phase input end when the control end of the $(5A)^{th}$ switching element has received the second control signal.

The structure of the $A^{th}$ switching control module will be described hereinafter when A is 1.

Figure 2A:
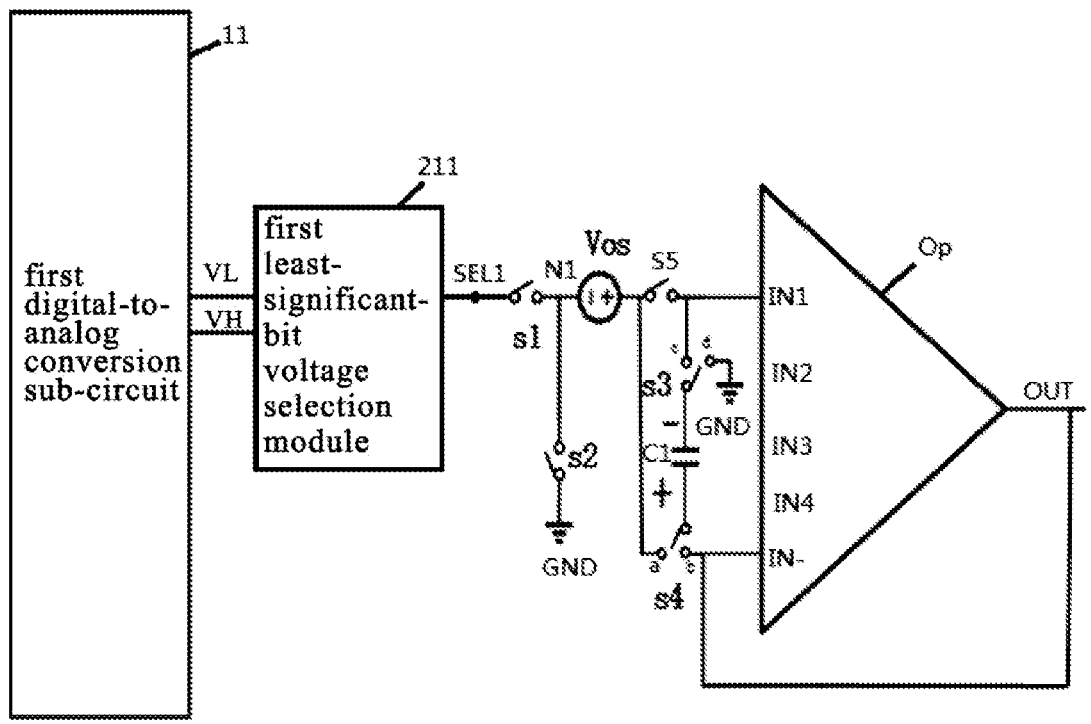
FIG. 2A is another schematic view showing the digital-to-analog conversion circuit according to one embodiment of the present disclosure.

On the basis of the digital-to-analog circuit in FIG. 1, the second least-significant-bit voltage selection module 212, the second switching control module 222, the second energy storage module 232, the third least-significant-bit voltage selection module 213, the third switching control module 223, the third energy storage module 233, the fourth least-significant-bit voltage selection module 214, the fourth switching control module 242, and the fourth energy storage module 234 are not shown in FIG. 2A. IN2, IN3 and IN4 may each be in a floating state. The first energy storage module 231 may include a first capacitor C1.

Figure 2B:
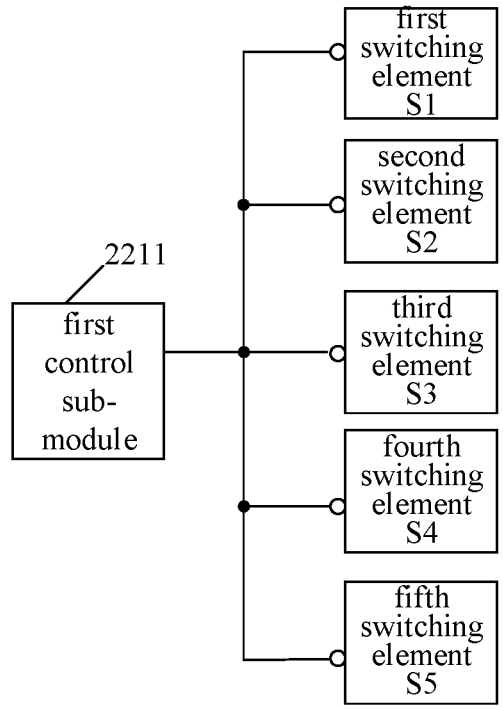
FIG. 2B is yet another schematic view showing the digital-to-analog conversion circuit according to one embodiment of the present disclosure.

As shown in FIG. 2B, the first switching module 221 may include a first control sub-module 2211, a first switching element S1, a second switching element S2, a third switching element S3, a fourth switching element S4 and a fifth switching element S5. A control end of the first switching element S1, a control end of the second switching element S2, a control end of the third switching element S3, a control end of the fourth switching element S4 and a control end of the fifth switching element S5 may be connected to the first control sub-module.

The first control sub-module is configured to output the first control signal at the offset voltage calibration stage, and output the second control signal at the digital-to-analog conversion stage.

A first end of the first switching element S1 may be connected to the first selection output end SEL1, and a second end of the first switching element S1 may be connected to the first same-phase node N1. The first switching element S1 is configured to control the first selection output end SEL1 to be electrically disconnected from the first same-phase node N1 when the control end of the first switching element S1 has received the first control signal, and control the first selection output end SEL1 to be electrically connected to the first same-phase node N1 when the control end of the first switching element S1 has received the second control signal.

A first end of the second switching element S2 may be connected to the first same-phase node N1, and a second end of the second switching element S2 may be connected to the ground end GND. The second switching element S2 is configured to control the first same-phase node N1 to be electrically connected to the ground end GND when the control end of the second switching element S2 has received the first control signal, and control the first same-phase node N1 to be electrically disconnected from the ground end GND when the control end of the second switching element S2 has received the second control signal.

A first end c of the third switching element S3 may be connected to the first same-phase input end IN1, a fixed end of the third switching element S3 may be connected to a first end of the first capacitor C1, and a second end d of the third switching element S3 may be connected to the ground end GND. The third switching element S3 is configured to control the first end of the first capacitor C1 to be electrically connected to the ground end GND when the control end of the third switching element S3 has received the first control signal, and control the first end of the first capacitor C1 to be electrically disconnected from the ground end GND and control the first end of the first capacitor C1 to be electrically connected to the first same-phase input end IN1 when the control end of the third switching element S3 has received the second control signal.

A first end a of the fourth switching element S4 may be connected to the first same-phase node N1, a fixed end of the fourth switching element S4 may be connected to a second end of the first capacitor C1, and a second end b of the fourth switching element S4 may be connected to the reverse-phase input end IN-. The fourth switching element S4 is configured to control the second end of the first capacitor C1 to be electrically connected to the reverse-phase input end IN- when the control end of the fourth switching element S4 has received the first control signal, and control the second end of the first capacitor C1 to be electrically disconnected from the reverse-phase input end IN- and control the second end of the first capacitor C1 to be electrically connected to the first same-phase node N1 when the control end of the fourth switching element S4 has received the second control signal.

A first end of the fifth switching element S5 may be connected to the first same-phase node N1, and a second end of the fifth switching element S5 may be connected to the first same-phase input end IN1. The fifth switching element S5 is configured to control the first same-phase node N1 to be electrically connected to the first same-phase input end IN1 when the control end of the fifth switching element S5 has received the first control signal, and control the first same-phase node N1 to be electrically disconnected from the first same-phase input end IN1 when the control end of the fifth switching element S5 has received the second control signal.

In FIG. 2A, Vos represents an offset voltage applied to the first same-phase input end IN1 of the weighted summation operational amplifier Op. This offset voltage Vos is an inherent voltage applied to IN1, rather than being applied by an external device.

In FIG. 2A, an operating procedure of the digital-to-analog circuit may include the offset voltage calibration stage and the digital-to-analog conversion stage.

At the offset voltage calibration stage (i.e., a sampling stage), S1 may be opened, and S2 and S5 may be closed, so the fixed end of S3 may be electrically connected to the second end d of S3, the fixed end of S4 may be electrically connected to the second end b of S4, the first end of C1 may be grounded, and the second end of C1 may be electrically connected to the reverse-phase input end IN-1 of Op. At this time, a voltage across C1 may be Vc, and a gain of Op may be A, so (Vos−Vc)*A=Vc, i.e., Vc=A*Vos/(A+1). The gain of Op is relatively large, so Vc may be approximately equal to Vos.

At the digital-to-analog conversion stage (i.e., a data transmission stage), S1 may be closed, and S2 and S5 may be opened, so the fixed end of S3 may be electrically connected to the first end c of S3, the fixed end of S4 may be electrically connected to the first end a of S4, the first end of C1 may be electrically connected to SEL1, and the second end of C1 may be electrically connected to IN1. The voltage Vc across C1 may cancel out Vos. In this way, it is able to eliminate the influence caused by the offset voltage during the digital-to-analog conversion.

In some embodiments of the present disclosure, the first digital-to-analog conversion sub-circuit may include a reference voltage output module, an input voltage control module, a most-significant-bit voltage selection module and a voltage storage module. The most-significant-bit voltage selection module may include $2^m$ input voltage ends. The reference voltage output module is configured to output $2^m+1$ reference voltages whose values increase gradually via $2^m+1$ reference voltage output ends.

The input voltage control module may be connected to an input voltage control end, the $2^m+1$ reference voltage output ends and the $2^m$ input voltage ends, and configured to, under the control of the input voltage control end, input the corresponding reference voltages to the $2^m$ input voltage ends via a first reference voltage output end to a $(2^m)^{th}$ reference voltage output end respectively within a first time period of each input period, and input the corresponding reference voltages to the $2^m$ input voltage ends via a second reference voltage output end to a $(2^m+1)^{th}$ reference voltage output end respectively within a second time period of each input period.

The most-significant-bit voltage selection module may include a selection voltage output end. The most-significant-bit voltage selection module is configured to select the reference voltage inputted by an $M^{th}$ input voltage end, and output the selected reference voltage to the voltage storage module via the selection voltage output end, where M is a decimal digit corresponding to the binary digits of m most significant bits in the binary digital signal having m+n bits.

The voltage storage module may be connected to a voltage storage control end, and configured to, under the control of the voltage storage control end, store and output the first voltage outputted by the most-significant-bit voltage selection module within the first time period and the second voltage outputted by the most-significant-bit voltage selection module within the second time period, and the first voltage may be smaller than the second voltage.

The voltage storage module may include a first voltage output end for outputting the first voltage and a second voltage output end for outputting the second voltage.

In some embodiments of the present disclosure, the reference voltage output module may include a resistor string, a first end of which is connected to a first power source voltage input end and a second end of which is connected to a second power source voltage input end. A first power source voltage inputted by the first power source voltage input end may be smaller than a second power source voltage inputted by the second power source voltage input end. The resistor string may include $2^m$ divider resistors connected in serial to each other. The first power source voltage input end may be connected to the first reference voltage output end, and the second power source voltage input end may be connected to the $(2^m+1)^{th}$ reference voltage output end. A connection line between a $C^{th}$ divider resistor and a $(C+1)^{th}$ divider resistor may be connected to a $(C+1)^{th}$ reference voltage output end of the reference voltage output module, where C+1 is smaller than or equal to $2^m$, and C is a positive integer.

Figure 3:
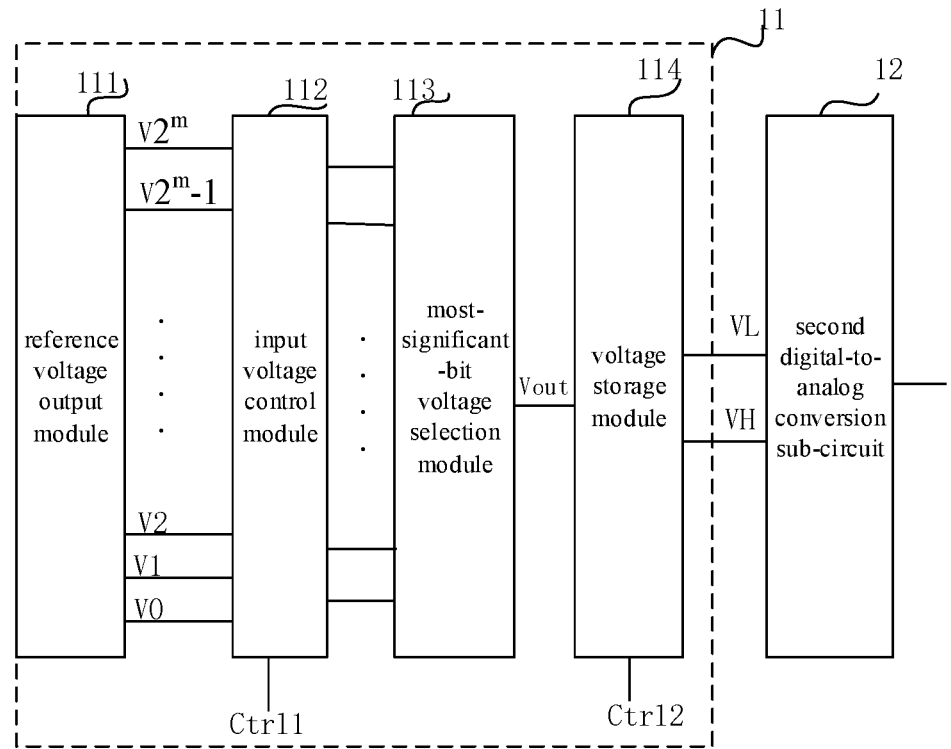
FIG. 3 is a schematic view showing a first digital-to-analog conversion sub-circuit of the digital-to-analog conversion circuit according to one embodiment of the present disclosure.

In some embodiments of the present disclosure, as shown in FIG. 3, the first digital-to-analog conversion sub-circuit 11 may include a reference voltage output module 111, an input voltage control module 112, a most-significant-bit voltage selection module 113 and a voltage storage module 114. The most-significant-bit voltage selection module 113 may include $2^m$ input voltage ends. The reference voltage output module 111 is configured to output $2^m+1$ reference voltages whose values increase gradually via $2^m+1$ reference voltage output ends.

The input voltage control module 112 may be connected to an input voltage control end Ctrl1, the reference voltage output module 111 includes the $2^m+1$ reference voltage output ends, the input voltage control module 112 may be connected to the $2^m+1$ reference voltage output ends. the most-significant-bit voltage selection module 113 includes the $2^m$ input voltage ends, the input voltage control module 112 may be connected to the $2^m$ input voltage ends. The input voltage control module 112 is configured to, under the control of the input voltage control end Ctrl1, input the corresponding reference voltages to the $2^m$ input voltage ends via a first reference voltage output end V0 to a $(2^m)^{th}$ reference voltage output end V$2^m$-1 respectively within a first time period of each input period, and input the corresponding reference voltages to the $2^m$ input voltage ends via a second reference voltage output end V1 to a $(2^m+1)^{th}$ reference voltage output end V$2^m$ respectively within a second time period of each input period.

The most-significant-bit voltage selection module 113 may include a selection voltage output end Vout. The most-significant-bit voltage selection module 113 is configured to select the reference voltage inputted by an $M^{th}$ input voltage end, and output the selected reference voltage to the voltage storage module 114 via the selection voltage output end Vout, where M is a decimal digit corresponding to the binary digits of m most significant bits in the binary digital signal having m+n bits.

The voltage storage module 114 may be connected to a voltage storage control end Ctrl2, and configured to, under the control of the voltage storage control end Ctrl2, store and output the first voltage VL outputted by the most-significant-bit voltage selection module 113 within the first time period and the second voltage VH outputted by the most-significant-bit voltage selection module 113 within the second time period, and the first voltage VL may be smaller than the second voltage VH. The voltage storage module 114 may include a first voltage output end for outputting the first voltage VL and a second voltage output end for outputting the second voltage VH.

The second digital-to-analog conversion sub-circuit 12 is configured to generate the analog voltage signal corresponding to the binary digital signal having m+n bits in accordance with the first voltage VL and the second voltage VH.

In some embodiments of the present disclosure, the input voltage control end Ctrl1 may be the same as the voltage storage control end Ctrl2.

In some other embodiments of the present disclosure, Ctrl1 may be different from Ctrl2.

In FIG. 3, V2 represents a third reference voltage output end, V$2^m$-1 represents a $(2^m)^{th}$ input voltage end, and V$2^m$ represents a $(2^m+1)^{th}$ input voltage end.

In the embodiments of the present disclosure, the digital-to-analog conversion circuit for performing the digital-to-analog conversion on the binary digital signal having m+n bits may include the first digital-to-analog conversion sub-circuit and the second digital-to-analog conversion sub-circuit. The first digital-to-analog conversion sub-circuit may include a reference voltage output module, an input voltage control module, a most-significant-bit selection module and a voltage storage module. The reference voltage output module may include a resistor string consisting of $2^m$ resistors connected in serial to each other.

In some embodiments of the present disclosure, the input voltage control module may include $2*2^m$ switching transistors, and the most-significant-bit voltage selection module may include $2*(2^m-1)$ switching transistors.

In the embodiments of the present disclosure, the digital-to-analog conversion circuit may perform the digital-to-analog conversion on the binary digital signal having m+n bits. To be specific, the first digital-to-analog conversion sub-circuit 11 may perform the digital-to-analog conversion on the binary digits of m most significant bits, and the second digital-to-analog conversion sub-circuit 12 may generate an analog voltage signal corresponding to the binary digital signal having m+n bits in accordance with the first voltage VL and the second voltage VH outputted by the first digital-to-analog conversion sub-circuit 11. For example, m may be 9, and n may be 3.

The digital-to-analog conversion circuit will be described hereinafter when m is 9 and n is 3. Of course, m and n may each be of any other value according to the practical need, e.g., n may be 10 and m may be 2.

Figure 4:
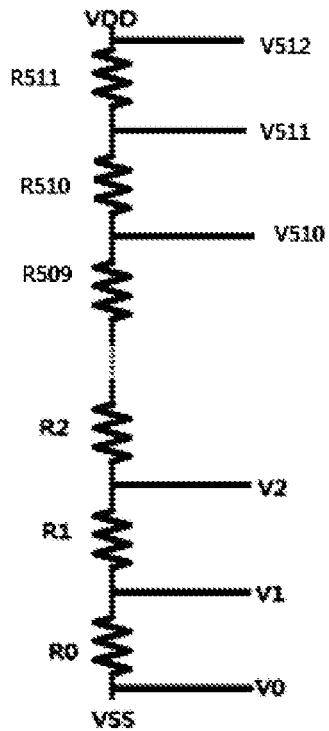
FIG. 4 is a schematic view showing a reference voltage output module according to one embodiment of the present disclosure.

In some embodiments of the present disclosure, as shown in FIG. 4, when m is 9, the reference voltage output module may include a resistor string consisting of 512 (i.e., $2^9$) resistors connected in serial to each other. In FIG. 4, R0 represents a first divider resistor, R1 represents a second divider resistor, R2 represents a third divider resistor, R509 represents a $510^{th}$ divider resistor, R510 represents a $511^{th}$ divider resistor, and R511 represents a $512^{th}$ divider resistor. In other words, Rj represents a $(j+1)^{th}$ divider resistor, where j is a natural number smaller than $2^m$.

A first end of the first divider resistor R0 may be connected to a low power source voltage input end for inputting a low power source voltage VSS, and a second end of the first divider resistor R0 may be connected to the second divider resistor R1. A first end of R511 may be connected to R510, and a second of R511 may be connected to a high power source voltage input end for inputting a high power source voltage VDD. The first end of the first divider resistor R0 may be further connected to the first reference voltage output end V0. The second end of R511 may be further connected to a $513^{th}$ reference voltage output end V512.

A connection line between a $C^{th}$ divider resistor and a $(C+1)^{th}$ divider resistor may be connected to a $(C+1)^{th}$ reference voltage output end of the reference voltage output module, where C+1 is smaller than or equal to $2^m$, and C is a positive integer.

For example, a connection line between the first divider resistor R0 and the second divider resistor R1 may be connected to a second reference voltage output end V1, a connection line between the second divider resistor R1 and the third divider resistor R2 may be connected to the third reference voltage output end V2, a connection line between R509 and the $511^{th}$ divider resistor R510 may be connected to a $511^{th}$ reference voltage output end V510, and a connection line between the $511^{th}$ divider resistor R510 and the $512^{th}$ divider resistor R511 may be connected to a $512^{th}$ reference voltage output end V511.

In some embodiments of the present disclosure, for the reference voltage output module in FIG. 4, all the divider resistors may have a same resistance. When all the divider resistors have the same resistance, 513 reference voltages having an equal difference may be generated at the ends of the divider resistors.

In some embodiments of the present disclosure, when a binary digit of the 9 most significant bits is 111111111, the first voltage VL may be V511, and the second voltage VH may be V512.

In the embodiments of the present disclosure, the first digital-to-analog conversion sub-circuit of the digital-to-analog conversion circuit is a 9-bit digital-to-analog conversion sub-circuit, so the reference voltage output module of the first digital-to-analog conversion sub-circuit need to use 512 divider resistors.

In some embodiments of the present disclosure, the most-significant-bit voltage selection module may include a binary switch tree.

Figure 5:
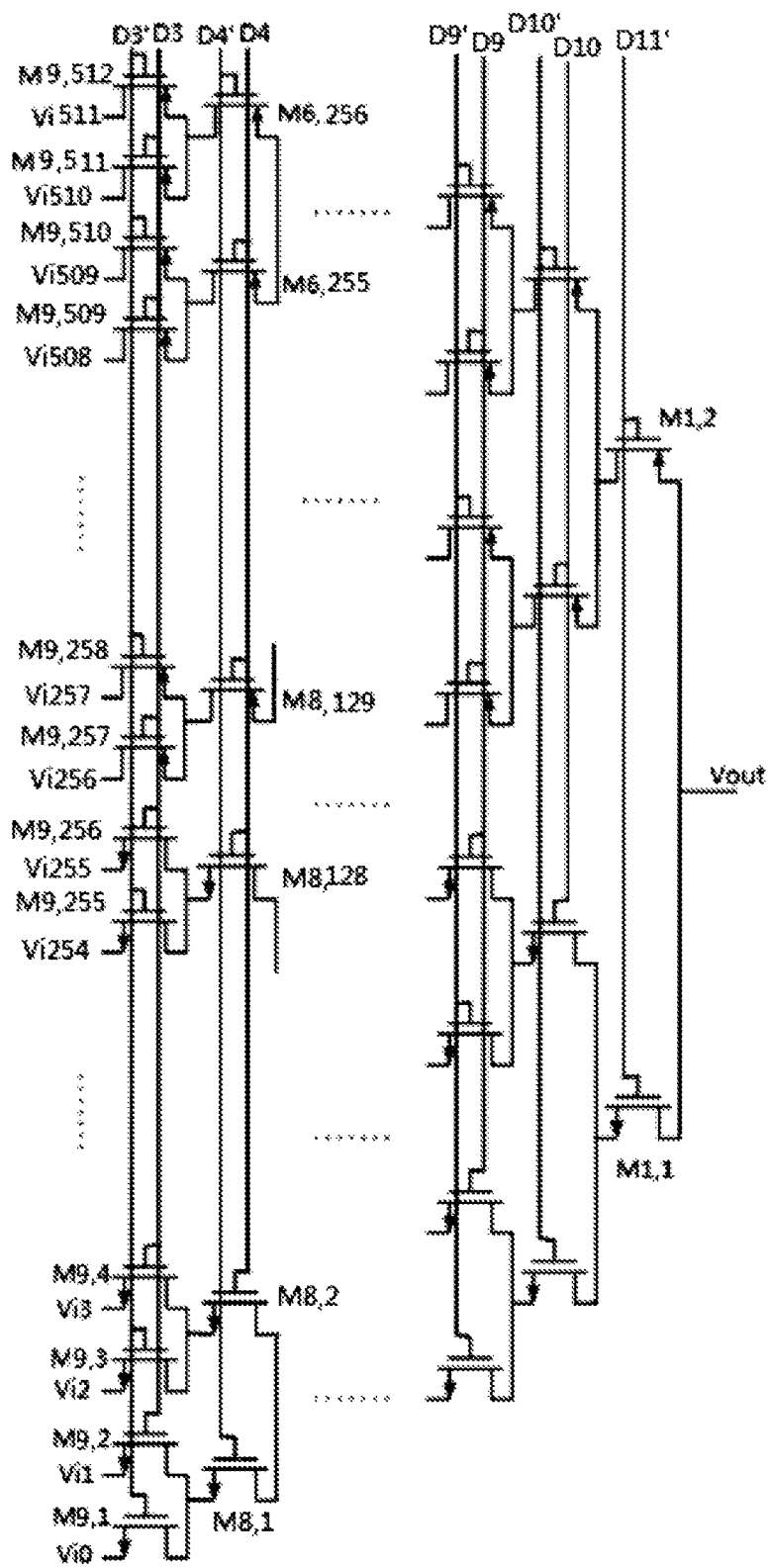
FIG. 5 is a circuit diagram of a most-significant-bit voltage selection module according to one embodiment of the present disclosure.

FIG. 5 shows a circuit diagram of the most-significant-bit voltage selection module of the first digital-to-analog conversion sub-circuit in the digital-to-analog conversion circuit (when m is 9).

As shown in FIG. 5, the binary switch tree may include 9 layers. A first layer may include 2 (i.e., $2^1$) switch branches connected to the selection voltage output end Vout, and a ninth layer may include 512 (i.e., $2^9$) switch branches connected to 512 (i.e., $2^9$) input voltage ends of the input voltage control module respectively. In addition, an $a^{th}$ layer (a is a positive integer greater than 1 and smaller than 9) may include $2^a$ switch branches connected between an $(a-1)^{th}$ layer and an $(a+1)^{th}$ layer. At each layer, every two adjacent switch branches may be connected to each other. Each of the nine layers may be controlled by one of the nine digits, so that one of the two adjacent switch branches may be turned on so as to select a corresponding input voltage. In this way, the 512 input voltages may be selected layer by layer, so as to enable the selection voltage output end Vout to output voltages corresponding to the binary digits of the 9 most significant bits (D11D10D9D8 . . . D3) in the binary digital signal having 9+3 bits.

In some embodiments of the present disclosure, in each switch branch, a single transistor, e.g., an n-type or p-type transistor, may server as the switching element.

In some embodiments of the present disclosure, any controllable switching device into which a gate signal is to be applied (e.g., a CMOS transmission gate) may serve as the switching element.

For the most-significant-bit voltage selection module in FIG. 5, a single transistor may be used as the switching element. In addition, the switching elements for the switch branches corresponding to high voltages in the 512 input voltages greater than or equal to a predetermined voltage may be set as p-type transistors, and switching elements for the switch branches corresponding to low voltages in the 512 input voltages smaller than or equal to a predetermined voltage may be set as n-type transistors. The predetermined voltage for differentiating the high voltage and the low voltage may be an intermediate voltage in the 512 input voltages. For example, the input voltages greater than or equal to a $257^{th}$ input voltage may be the high voltages, and the input voltages smaller than the $257^{th}$ input voltage may be the low voltages. Of course, the predetermined voltage may not be limited to the intermediate voltage of the 512 input voltages, as long as it has a value within an intermediate range.

For the most-significant-bit voltage selection module in FIG. 5, a single transistor may be selected as the switching element to transfer the voltage, so it is able to reduce the quantity of the switches, thereby to reduce a size of a chip.

In some embodiments of the present disclosure, a high-grayscale data voltage may be transferred via the p-type transistor, and a low-grayscale data voltage may be transferred via the n-type transistor.

The p-type transistor is capable of transferring a high voltage stably, and the n-type transistor is capable of transferring a low voltage stably. Based on this, in the embodiments of the present disclosure, the p-type transistor may be used to transfer the high-grayscale data voltage, and the n-type transistor may be used to transfer the low-grayscale data voltage, so as to transfer all the voltages in a stable manner.

The high-significant-bit selection module in FIG. 5 will be described hereinafter in more details.

The ninth layer of the binary switch tree may include 256 n-type transistors (M9,1; M9,2; M9,3; M9,4; . . . ; M9,255; M9,256) and 256 p-type transistors (M9,257; M9,258; . . . ; M9,508; M9,509; M9,510; M9,511; M9,512). A first electrode of each transistor is configured to receive a corresponding input voltage. For example, a first electrode of a first n-type transistor M9,1 is configured to receive a first input voltage Vi0, a first electrode of a second n-type transistor M9,2 is configured to receive a second input voltage Vi1, a first electrode of a third n-type transistor M9,3 is configured to receive a third input voltage Vi2, a first electrode of a fourth n-type transistor M9,4 is configured to receive a fourth input voltage Vi3, a first electrode of a $255^{th}$ n-type transistor M9,255 is configured to receive a $255^{th}$ input voltage Vi254, a first electrode of a $256^{th}$ n-type transistor M9,256 is configured to receive a $256^{th}$ input voltage Vi255, a first electrode of a first p-type transistor M9,257 is configured to receive a $257^{th}$ input voltage Vi256, a first electrode of a second p-type transistor M9,258 is configured to receive a $258^{th}$ input voltage Vi257, a first electrode of a $253^{rd}$ p-type transistor M9,509 is configured to receive a $509^{th}$ input voltage Vi508, a first electrode of a $254^{th}$ p-type transistor M9,510 is configured to receive a $510^{th}$ input voltage Vi509, a first electrode of a $255^{th}$ p-type transistor M9,511 is configured to receive a $510^{th}$ input voltage Vi510, and a first electrode of a $256^{th}$ p-type transistor M9,512 is configured to receive a $512^{th}$ input voltage Vi511.

D3 (a fourth binary digit of the binary digits ranked in an ascending order in the binary digital signal having 12 bits, i.e., a first binary digit of the binary digits of the 9 most significant bits) and D3' (a digit complementary to D3, i.e., when D3 is 0, D3' may be 1, and when D3 is 1, D3' may be 0) may be applied to gate electrodes of all the transistors at the ninth layer alternately. For example, when D3' is applied to the gate electrode of M9,1, D3 may be applied to the gate electrode of M9,2.

The eighth layer of the binary switch tree may include 128 n-type transistors (M8,1; M8,2; . . . ; M8,127; M8,128) and 128 p-type transistors (M8,129; M8,130; . . . ; M8,255; M8,256). A first electrode of each transistor may be connected to a second electrode of each of the adjacent transistors at the ninth layer. For example, a first electrode of M8,1 may be connected to a second electrode of M9,1 and a second electrode of M9,2, a first electrode M8,2 may be connected to a second electrode of M9,3 and a second electrode of M9,4, a first electrode of M8,128 may be connected to a second electrode of M9,255 and a second electrode of M9,256, a first electrode of M8,129 may be connected to a second electrode of M9,257 and a second electrode of M9,258, a first electrode of M8,255 may be connected to a second electrode of M9,509 and a second electrode of M9,510, and a first electrode of M8,256 may be connected to a second electrode of M9,511 and a second electrode of M9,512.

D4 (a fifth binary digit of the binary digits ranked in an ascending order in the binary digital signal having 12 bits, i.e., a second binary digit of the binary digits of the 9 most significant bits) and D4' (a digit complementary to D4, i.e., when D4 is 0, D4' may be 1, and when D4 is 1, D4' may be 0) may be applied to gate electrodes of all the transistors at the eighth layer alternately. For example, when D4' is applied to the gate electrode of M8,1, D4 may be applied to the gate electrode of M8,2.

The seventh to the second layers of the binary switch tree may be configured in a similar way, which will not be particularly defined herein.

In FIG. 5, D9 represents a tenth digit of the binary digits ranked in an ascending order in the binary digital signal having 12 bits, i.e., a seventh binary digit of the binary digits of the 9 most significant bits, and D9' is a digit complementary to D9. When D9 is 0, D9' may be 1, and when D9 is 1, D9' may be 0.

D10 represents an eleventh digit of the binary digits ranked in an ascending order in the binary digital signal having 12 bits, i.e., an eighth binary digit of the binary digits of the 9 most significant bits, and D10' is a digit complementary to D10. When D10 is 0, D10' may be 1, and when D10 is 1, D10' may be 0.

The third layer of the binary switch tree may include 4 n-type transistors M3,1; M3,2; M3,3 and M3,4, and 4 p-type transistors M3,5; M3,6; M3,7 and M3,8.

The second layer of the binary switch tree may include 2 n-type transistors M2,1 and M2,2, and 2 p-type transistors M2,3 and M2,4.

The first layer of the binary switch tree may include one n-type transistor M1,1 and one p-type transistor M1,2. A first electrode of M1,1 may be connected to a second electrode of M2,1 and a second electrode of M2,2, and a first electrode of M1,2 may be connected to a second electrode of M2,3 and a second electrode of M2,4. A gate electrode of M1,1 and a gate electrode of M1,2 may each receive D11' complementary to D11 (highest binary digit of the binary digit signal having 12 bits). When D11 is 0, D11' may be 1, and when D11 is 1, D11' may be 0. A second electrode of M1,1 and a second electrode of M1,2 may be connected to the selection voltage output end Vout.

In some embodiments of the present disclosure, when the digital signal D11D10D9D8D7D6D5D4D3 is 000000000, the voltage outputted by Vout may be the first input voltage Vi0, and when the digital signal D11D10D9D8D7D6D5D4D3 is 111111111, the voltage outputted by Vout may be the $512^{th}$ input voltage Vi512.

The present disclosure further provides in some embodiments a digital-to-analog conversion method for the above-mentioned digital-to-analog conversion circuit. As shown in FIG. 6, the digital-to-analog conversion method includes: at a digital-to-analog conversion stage and an offset voltage calibration stage, controlling, by an $A^{th}$ switching control module, an $A^{th}$ selection output end to be electrically connected to, or electrically disconnected from, an $A^{th}$ same-phase node, controlling, by the $A^{th}$ switching control module, the $A^{th}$ same-phase node to be electrically connected to, or electrically disconnected from, a first level input end, controlling, by the $A^{th}$ switching control module, a first end of an $A^{th}$ energy storage module to be electrically connected to an $A^{th}$ same-phase input end or the first level input end, controlling, by the $A^{th}$ switching control module, a second end of the $A^{th}$ energy storage module to be electrically connected to the $A^{th}$ same-phase node or a reverse-phase input end, and controlling, by the $A^{th}$ switching control module, the $A^{th}$ same-phase node to be electrically connected to, or electrically disconnected from, the $A^{th}$ same-phase input end; and at the digital-to-analog conversion stage, converting, by a first digital-to-analog conversion sub-circuit, binary digits of m most significant bits in a binary digital signal having m+n bits into a first voltage and a second voltage greater than the first voltage, performing, by a weighted summation operational amplifier of a second digital-to-analog conversion sub-circuit, weighted summation on voltages inputted by same-phase input ends whose quantity is a to acquire an analog voltage, outputting, by the weighted summation operational amplifier, the analog voltage via an operational amplification output end, and outputting, by an $A^{th}$ least-significant-bit voltage selection module, the first voltage or the second voltage via the $A^{th}$ selection output end in accordance with binary digits of n least significant bits in the binary digital signal having m+n bits, where m and n are each an integer greater than 1, a is an integer greater than 1, and A is a positive integer smaller than or equal to a.

In some embodiments of the present disclosure, the controlling, by the $A^{th}$ switching control module, the $A^{th}$ selection output end to be electrically connected to, or electrically disconnected from, the $A^{th}$ same-phase node, controlling, by the $A^{th}$ switching control module, the $A^{th}$ same-phase node to be electrically connected to, or electrically disconnected from, the first level input end, controlling, by the $A^{th}$ switching control module, the first end of the $A^{th}$ energy storage module to be electrically connected to the $A^{th}$ same-phase input end or the first level input end, controlling, by the $A^{th}$ switching control module, the second end of the $A^{th}$ energy storage module to be electrically connected to the $A^{th}$ same-phase node or the reverse-phase input end, and controlling, by the $A^{th}$ switching control module, the $A^{th}$ same-phase node to be electrically connected to, or electrically disconnected from, the $A^{th}$ same-phase input end may include: at the offset voltage calibration stage, controlling, by the $A^{th}$ switching control module, the $A^{th}$ same-phase node to be electrically connected to the first level input end, controlling, by the $A^{th}$ switching control module, the first end of the $A^{th}$ energy storage module to be electrically connected to the first level input end, controlling, by the $A^{th}$ switching control module, the second end of the $A^{th}$ energy storage module to be electrically connected to the reverse-phase input end, and controlling, by the $A^{th}$ switching control module, the $A^{th}$ same-phase node to be electrically connected to the $A^{th}$ same-phase input end; and at the digital-to-analog conversion stage, controlling, by the $A^{th}$ switching control module, the $A^{th}$ same-phase node to be electrically disconnected from the first level input end, controlling, by the $A^{th}$ switching control module, the first end of the $A^{th}$ energy storage module to be electrically disconnected from the first level input end, controlling, by the $A^{th}$ switching control module, the second end of the $A^{th}$ energy storage module to be electrically disconnected from the reverse-phase input end, controlling, by the $A^{th}$ switching control module, the $A^{th}$ same-phase node to be electrically disconnected from the $A^{th}$ same-phase input end, controlling, by the $A^{th}$ switching control module, the $A^{th}$ selection output end to be electrically connected to the $A^{th}$ same-phase node, controlling, by the $A^{th}$ switching control module, the first end of the $A^{th}$ energy storage module to be electrically connected to the $A^{th}$ same-phase input end, and controlling, by the $A^{th}$ switching control module, the second end of the $A^{th}$ energy storage module to be electrically connected to the $A^{th}$ same-phase node.

The present disclosure further provides in some embodiments a display device including the above-mentioned digital-to-analog conversion circuit.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A digital-to-analog conversion circuit, comprising a first digital-to-analog conversion sub-circuit and a second digital-to-analog conversion sub-circuit, wherein
the digital-to-analog conversion circuit is configured to perform digital-to-analog conversion on a binary digital signal having m+n bits, where m and n are each an integer greater than 1;
the first digital-to-analog conversion sub-circuit is configured to convert binary digits of m most significant bits in the binary digital signal having m+n bits into a first voltage and a second voltage, the first voltage is smaller than the second voltage;
the second digital-to-analog conversion sub-circuit comprises least-significant-bit voltage selection modules whose quantity is a, a weighed summation operational amplifier, switching control modules whose quantity is a and energy storage modules whose quantity is a;
the weighted summation operational amplifier comprises a reverse-phase input end, an operational amplification output end, and same-phase input ends whose quantity is a;
the reverse-phase input end is connected to the operational amplification output end;
the weighted summation operational amplifier is configured to perform weighted summation on voltages inputted by the a same-phase input ends at a digital-to-analog conversion stage to acquire an analog voltage, and output the analog voltage via the operational amplification output end, where a is an integer greater than 1;
an $A^{th}$ least-significant-bit voltage selection module comprises an $A^{th}$ selection output end;
the $A^{th}$ least-significant-bit voltage selection module is configured to output the first voltage or the second voltage via the $A^{th}$ selection output end in accordance with a binary digit of a corresponding one of n least significant bits in the binary digital signal having m+n bits, where A is a positive integer smaller than or equal to a; and
an $A^{th}$ switching control module is configured to control the $A^{th}$ selection output end to be electrically connected to, or electrically disconnected from, an $A^{th}$ same-phase node, control the $A^{th}$ same-phase node to be electrically connected to, or electrically disconnected from, a first level input end, control a first end of an $A^{th}$ energy storage module to be electrically connected to an $A^{th}$ same-phase input end or the first low level input end, control a second end of the $A^{th}$ energy storage module to be electrically connected to the $A^{th}$ same-phase node or the reverse-phase input end, and control the $A^{th}$ same-phase node to be electrically connected to, or electrically disconnected from, the $A^{th}$ same-phase input end.

2. The digital-to-analog conversion circuit according to claim 1, wherein the $A^{th}$ switching control module is further configured to, at an offset voltage calibration stage, control the $A^{th}$ same-phase node to be electrically connected to the first level input end, control the first end of the $A^{th}$ energy storage module to be electrically connected to the first level input end, control the second end of the $A^{th}$ energy storage module to be electrically connected to the reverse-phase input end, and control the $A^{th}$ same-phase node to be electrically connected to the $A^{th}$ same-phase input end; and
the $A^{th}$ switching control module is further configured to, at the digital-to-analog conversion stage, control the $A^{th}$ same-phase node to be electrically disconnected from the first level input end, control the first end of the $A^{th}$ energy storage module to be electrically disconnected from the first level input end, control the second end of the $A^{th}$ energy storage module to be electrically disconnected from the reverse-phase input end, control the $A^{th}$ same-phase node to be electrically disconnected from the $A^{th}$ same-phase input end, control the $A^{th}$ selection output end to be electrically connected to the $A^{th}$ same-phase node, control the first end of the $A^{th}$ energy storage module to be electrically connected to the $A^{th}$ same-phase input end, and control the second end of the $A^{th}$ energy storage module to be electrically connected to the $A^{th}$ same-phase node.

3. The digital-to-analog conversion circuit according to claim 2, further comprising a bias current control sub-circuit configured to supply a first bias current to the weighted summation operational amplifier at the offset voltage calibration stage, and supply a second bias current to the weighted summation operational amplifier at the digital-to-analog conversion stage, wherein the first bias current is smaller than the second bias current.

4. The digital-to-analog conversion circuit according to claim 1, wherein a is equal to n+1, N is a positive integer smaller than or equal to n, and the first voltage is applied to an $(n+1)^{th}$ same-phase input end of the weighted summation operational amplifier;
- an $N^{th}$ least-significant-bit voltage selection module is configured to output the first voltage or the second voltage via an $N^{th}$ selection output end in accordance with an $N^{th}$ digit of the binary digits of n least significant bits ranked in a descending order in the binary digital signal having m+n bits;
- an $N^{th}$ switching control module is configured to control the $N^{th}$ selection output end to be electrically connected to, or electrically disconnected from, an $N^{th}$ same-phase node, control the $N^{th}$ same-phase node to be electrically connected to, or electrically disconnected from, the first level input end, control a first end of an $N^{th}$ energy storage module to be electrically connected to an $N^{th}$ same-phase input end or the first level input end, control a second end of the $N^{th}$ energy storage module to be electrically connected to the $N^{th}$ same-phase node or the reverse-phase input end, and control the $N^{th}$ same-phase node to be electrically connected to, or electrically disconnected from, the $N^{th}$ same-phase input end; and
- an $(n+1)^{th}$ switching control module is configured to control an $(n+1)^{th}$ selection output end to be electrically connected to, or electrically disconnected from, an $(n+1)^{th}$ same-phase node, control the $(n+1)^{th}$ same-phase node to be electrically connected to, or electrically disconnected from, the first level input end, control a first end of an $(n+1)^{th}$ energy storage module to be electrically connected to the $(n+1)^{th}$ same-phase input end or the first level input end, control a second end of the $(n+1)^{th}$ energy storage module to be electrically connected to the $(n+1)^{th}$ same-phase node or the reverse-phase input end, and control the $(n+1)^{th}$ same-phase node to be electrically connected to, or electrically disconnected from, the $(n+1)^{th}$ same-phase input end.

5. The digital-to-analog conversion circuit according to claim 1, wherein the $A^{th}$ energy storage module comprises an $A^{th}$ capacitor, and the $A^{th}$ switching control module comprises an $A^{th}$ control sub-module, a $(5A-4)^{th}$ switching element, a $(5A-3)^{th}$ switching element, a $(5A-2)^{th}$ switching element, a $(5A-1)^{th}$ switching element and a $(5A)^{th}$ switching element;
- a control end of the $(5A-4)^{th}$ switching element, a control end of the $(5A-3)^{th}$ switching element, a control end of the $(5A-2)^{th}$ switching element, a control end of the $(5A-1)^{th}$ switching element and a control end of the $(5A)^{th}$ switching element are connected to the $A^{th}$ control sub-module;
- the $A^{th}$ control sub-module is configured to output a first control signal at the offset voltage calibration stage, and output a second control signal at the digital-to-analog conversion stage;
- a first end of the $(5A-4)^{th}$ switching element is connected to the $A^{th}$ selection output end, and a second end of the $(5A-4)^{th}$ switching element is connected to the $A^{th}$ same-phase node;
- the $(5A-4)^{th}$ switching element is configured to control the $A^{th}$ selection output end to be electrically disconnected from the $A^{th}$ same-phase node when the control end of the $(5A-4)^{th}$ switching element has received the first control signal, and control the $A^{th}$ selection output end to be electrically connected to the $A^{th}$ same-phase node when the control end of the $(5A-4)^{th}$ switching element has received the second control signal;
- a first end of the $(5A-3)^{th}$ switching element is connected to the $A^{th}$ same-phase node, and a second end of the $(5A-3)^{th}$ switching element is connected to the first level input end;
- the $(5A-3)^{th}$ switching element is configured to control the $A^{th}$ same-phase node to be electrically connected to the first level input end when the control end of the $(5A-3)^{th}$ switching element has received the first control signal, and control the $A^{th}$ same-phase node to be electrically disconnected from the first level input end when the control end of the $(5A-3)^{th}$ switching element has received the second control signal;
- a first end of the $(5A-2)^{th}$ switching element is connected to the $A^{th}$ same-phase input end, a fixed end of the $(5A-2)^{th}$ switching element is connected to a first end of the $A^{th}$ capacitor, and a second end of the $(5A-2)^{th}$ switching element is connected to the first level input end;
- the $(5A-2)^{th}$ switching element is configured to control the first end of the $A^{th}$ capacitor to be electrically connected to the first level input end when the control end of the $(5A-2)^{th}$ switching element has received the first control signal, and control the first end of the $A^{th}$ capacitor to be electrically disconnected from the first level input end and control the first end of the $A^{th}$ capacitor to be electrically connected to the $A^{th}$ same-phase input end when the control end of the $(5A-2)^{th}$ switching element has received the second control signal;
- a first end of the $(5A-1)^{th}$ switching element is connected to the $A^{th}$ same-phase node, a fixed end of the $(5A-1)^{th}$ switching element is connected to a second end of the $A^{th}$ capacitor, and a second end of the $(5A-1)^{th}$ switching element is connected to the reverse-phase input end;
- the $(5A-1)^{th}$ switching element is configured to control the second end of the $A^{th}$ capacitor to be electrically connected to the reverse-phase input end when the control end of the $(5A-1)^{th}$ switching element has received the first control signal, and control the second end of the $A^{th}$ capacitor to be electrically disconnected from the reverse-phase input end and control the second end of the $A^{th}$ capacitor to be electrically connected to the $A^{th}$ same-phase node when the control end of the $(5A-1)^{th}$ switching element has received the second control signal;
- a first end of the $(5A)^{th}$ switching element is connected to the $A^{th}$ same-phase node, and a second end of the $(5A)^{th}$ switching element is connected to the $A^{th}$ same-phase input end; and
- the $(5A)^{th}$ switching element is configured to control the $A^{th}$ same-phase node to be electrically connected to the $A^{th}$ same-phase input end when the control end of the $(5A)^{th}$ switching element has received the first control signal, and control the $A^{th}$ same-phase node to be electrically disconnected from the $A^{th}$ same-phase input end when the control end of the $(5A)^{th}$ switching element has received the second control signal.

6. The digital-to-analog conversion circuit according to claim 1, wherein the first digital-to-analog conversion sub-circuit comprises a reference voltage output module, an input voltage control module, a most-significant-bit voltage selection module and a voltage storage module;

the most-significant-bit voltage selection module comprises $2^m$ input voltage ends, and the reference voltage output module comprises $2^m+1$ reference voltage output ends;

the reference voltage output module is configured to output $2^m+1$ reference voltages whose values increase gradually via the $2^m+1$ reference voltage output ends;

the input voltage control module is connected to an input voltage control end, the $2^m+1$ reference voltage output ends and the $2^m$ input voltage ends, and configured to, under the control of the input voltage control end, input the corresponding reference voltages to the $2^m$ input voltage ends via a first reference voltage output end to a $(2^m)^{th}$ reference voltage output end respectively within a first time period of each input period, and input the corresponding reference voltages to the $2^m$ input voltage ends via a second reference voltage output end to a $(2m+1)^{th}$ reference voltage output end respectively within a second time period of each input period;

the most-significant-bit voltage selection module comprises a selection voltage output end, and is configured to select the reference voltage inputted by an $M^{th}$ input voltage end, and output the selected reference voltage to the voltage storage module via the selection voltage output end, where M is a decimal digit corresponding to the binary digits of m most significant bits in the binary digital signal having m+n bits;

the voltage storage module is connected to a voltage storage control end, and configured to, under the control of the voltage storage control end, store and output the first voltage outputted by the most-significant-bit voltage selection module within the first time period and the second voltage outputted by the most-significant-bit voltage selection module within the second time period, and the first voltage is smaller than the second voltage; and the voltage storage module comprises a first voltage output end for outputting the first voltage and a second voltage output end for outputting the second voltage.

7. The digital-to-analog conversion circuit according to claim 6, wherein the reference voltage output module comprises a resistor string, a first end of which is connected to a first power source voltage input end and a second end of which is connected to a second power source voltage input end;

a first power source voltage inputted by the first power source voltage input end is smaller than a second power source voltage inputted by the second power source voltage input end;

the resistor string comprises $2^m$ divider resistors connected in serial to each other;

the first power source voltage input end is connected to the first reference voltage output end, and the second power source voltage input end is connected to the $(2^m+1)^{th}$ reference voltage output end; and a connection line between a $C^{th}$ divider resistor and a $(C+1)^{th}$ divider resistor is connected to a $(C+1)^{th}$ reference voltage output end of the reference voltage output module, where C+1 is smaller than or equal to $2^m$, and C is a positive integer.

8. The digital-to-analog conversion circuit according to claim 6, wherein the most-significant-bit voltage selection module comprises a binary switch tree;

the binary switch tree comprises m layers, a $w^{th}$ layer comprises $2^w$ switch branches, where w is a positive integer smaller than m;

the $w^{th}$ layer is connected between a $(w-1)^{th}$ layer and a $(w+1)^{th}$ layer;

two switch branches of a first layer are connected to the selection voltage output end, and $2^m$ switch branches of an $m^{th}$ layer are connected to the $2^m$ input voltage ends of the input voltage control module respectively; and every two adjacent switch branches in each layer are connected to each other.

9. The digital-to-analog conversion circuit according to claim 8, wherein a single transistor is adopted by each switch branch as a switching element.

10. The digital-to-analog conversion circuit according to claim 9, wherein each switching element is an n-type or p-type transistor.

11. The digital-to-analog conversion circuit according to claim 10, wherein the $w^{th}$ layer of the binary switch tree comprises $2^{w-1}$ n-type transistors and $2^{w-1}$ p-type transistors, a first electrode of each transistor is configured to receive the corresponding input voltage, and gate electrodes of all the transistors are configured to receive Dk and Dk' alternately, where Dk represents an $(m+n-w+1)^{th}$ binary digit of the binary digits ranked in an ascending order in the binary digital signal having m+n bits, and Dk' represents a binary digit complementary to Dk.

12. The digital-to-analog conversion circuit according to claim 1, wherein the weighted summation operational amplifier is a multi-input buffer, a is equal to 4, and the weighted summation operational amplifier comprises four differential input pair transistors corresponding to four same-phase input ends respectively; and a ratio among a width-to-length ratio of a first differential input pair transistors corresponding to a first same-phase input end, a width-to-length ratio of a second differential input pair transistors corresponding to a second same-phase input end, a width-to-length ratio of a third second differential input pair transistors corresponding to a third same-phase input end and a width-to-length ratio of a fourth differential input pair transistors corresponding to a fourth same-phase input end is 4:2:1:1.

13. A digital-to-analog conversion method for the digital-to-analog conversion circuit according to claim 1, comprising:

at a digital-to-analog conversion stage and an offset voltage calibration stage, controlling, by an $A^{th}$ switching control module, an $A^{th}$ selection output end to be electrically connected to, or electrically disconnected from, an $A^{th}$ same-phase node, controlling, by the $A^{th}$ switching control module, the $A^{th}$ same-phase node to be electrically connected to, or electrically disconnected from, a first level input end, controlling, by the $A^{th}$ switching control module, a first end of an $A^{th}$ energy storage module to be electrically connected to an $A^{th}$ same-phase input end or the first level input end, controlling, by the $A^{th}$ switching control module, a second end of the $A^{th}$ energy storage module to be electrically connected to the $A^{th}$ same-phase node or a reverse-phase input end, and controlling, by the $A^{th}$ switching control module, the $A^{th}$ same-phase node to be electrically connected to, or electrically disconnected from, the $A^{th}$ same-phase input end; and at the digital-to-analog conversion stage, converting, by a first digital-to-analog conversion sub-circuit, binary digits of m most significant bits in a binary digital signal having m+n bits into a first voltage and a second voltage, the first voltage being smaller than the second voltage, performing, by a weighted summation operational amplifier of a second digital-to-analog conversion sub-circuit, weighted summation on voltages inputted by same-phase input ends whose quantity is a to acquire an analog voltage, outputting, by the weighted summation operational amplifier, the analog voltage via an operational amplification output end, and outputting, by an $A^{th}$ least-significant-bit voltage selection module, the first voltage or the second voltage via the $A^{th}$ selection output end in accordance with a binary digit of a corresponding one of n least significant bits in the binary digital signal having m+n bits, where m and n are each an integer greater than 1, a is an integer greater than 1, and A is a positive integer smaller than or equal to a.

14. The digital-to-analog conversion method according to claim 13, wherein the controlling, by the $A^{th}$ switching control module, the $A^{th}$ selection output end to be electrically connected to, or electrically disconnected from, the $A^{th}$ same-phase node, controlling, by the $A^{th}$ switching control module, the $A^{th}$ same-phase node to be electrically connected to, or electrically disconnected from, the first level input end, controlling, by the $A^{th}$ switching control module, the first end of the $A^{th}$ energy storage module to be electrically connected to the $A^{th}$ same-phase input end or the first level input end, controlling, by the $A^{th}$ switching control module, the second end of the $A^{th}$ energy storage module to be electrically connected to the $A^{th}$ same-phase node or the reverse-phase input end, and controlling, by the $A^{th}$ switching control module, the $A^{th}$ same-phase node to be electrically connected to, or electrically disconnected from, the $A^{th}$ same-phase input end comprises:

at the offset voltage calibration stage, controlling, by the $A^{th}$ switching control module, the $A^{th}$ same-phase node to be electrically connected to the first level input end, controlling, by the $A^{th}$ switching control module, the first end of the $A^{th}$ energy storage module to be electrically connected to the first level input end, controlling, by the $A^{th}$ switching control module, the second end of the $A^{th}$ energy storage module to be electrically connected to the reverse-phase input end, and controlling, by the $A^{th}$ switching control module, the $A^{th}$ same-phase node to be electrically connected to the $A^{th}$ same-phase input end; and at the digital-to-analog conversion stage, controlling, by the $A^{th}$ switching control module, the $A^{th}$ same-phase node to be electrically disconnected from the first level input end, controlling, by the $A^{th}$ switching control module, the first end of the $A^{th}$ energy storage module to be electrically disconnected from the first level input end, controlling, by the $A^{th}$ switching control module, the second end of the $A^{th}$ energy storage module to be electrically disconnected from the reverse-phase input end, controlling, by the $A^{th}$ switching control module, the $A^{th}$ same-phase node to be electrically disconnected from the $A^{th}$ same-phase input end, controlling, by the $A^{th}$ switching control module, the $A^{th}$ selection output end to be electrically connected to the $A^{th}$ same-phase node, controlling, by the $A^{th}$ switching control module, the first end of the $A^{th}$ energy storage module to be electrically connected to the $A^{th}$ same-phase input end, and controlling, by the $A^{th}$ switching control module, the second end of the $A^{th}$ energy storage module to be electrically connected to the $A^{th}$ same-phase node.

15. A display device, comprising the digital-to-analog conversion circuit according to claim 1.

* * * * *